United States Patent
Liu et al.

(10) Patent No.: US 11,600,695 B2
(45) Date of Patent: Mar. 7, 2023

(54) DIELECTRIC FINS WITH AIR GAP AND BACKSIDE SELF-ALIGNED CONTACT

(71) Applicant: Taiwan Semiconductor Manufacturing Co., Ltd., Hsinchu (TW)

(72) Inventors: Ko-Cheng Liu, Hsinchu (TW); Ming-Shuan Li, Hsinchu County (TW); Ming-Lung Cheng, Kaohsiung County (TW); Chang-Miao Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 88 days.

(21) Appl. No.: 17/118,262

(22) Filed: Dec. 10, 2020

(65) Prior Publication Data
US 2021/0376071 A1  Dec. 2, 2021

Related U.S. Application Data

(60) Provisional application No. 63/032,365, filed on May 29, 2020.

(51) Int. Cl.
*H01L 29/06* (2006.01)
*H01L 21/8234* (2006.01)
(Continued)

(52) U.S. Cl.
CPC .. *H01L 29/0649* (2013.01); *H01L 21/823418* (2013.01); *H01L 21/823431* (2013.01);
(Continued)

(58) Field of Classification Search
CPC ........... H01L 29/0649; H01L 29/66795; H01L 29/1079; H01L 29/42376; H01L 29/42392;
(Continued)

(56) References Cited

U.S. PATENT DOCUMENTS

2019/0334008 A1* 10/2019 Chen ................. H01L 29/66795
2020/0343362 A1* 10/2020 Wu .................... H01L 29/66545
(Continued)

FOREIGN PATENT DOCUMENTS

KR  20160114223 A  10/2016
KR  20160132011 A  11/2016
(Continued)

OTHER PUBLICATIONS

Chen, Chun-Yuan et al., "Semiconductor Devices with Backside Air Gap Dielectric", U.S. Appl. No. 16/888,217, filed May 29, 2020, Assignee Taiwan Semiconductor Manufacturing Co., Ltd., 26 pages specification, 16 pages drawings.
(Continued)

*Primary Examiner* — Dao H Nguyen
(74) *Attorney, Agent, or Firm* — Haynes and Boone, LLP

(57) ABSTRACT

A method includes providing a structure having two fins extending from a substrate and an isolation structure adjacent to lower portions of the fins; forming a cladding layer over the isolation structure and over top and sidewalls of the fins; recessing the isolation structure using the cladding layer as an etch mask to expose the substrate; after the recessing of the isolation structure, depositing a seal layer over the substrate, the isolation structure, and the cladding layer; forming a sacrificial plug over the seal layer and between the two fins; and depositing a dielectric top cover over the sacrificial plug and laterally between the two fins.

20 Claims, 32 Drawing Sheets

(51) Int. Cl.
    *H01L 29/66*       (2006.01)
    *H01L 27/092*      (2006.01)
    *H01L 23/522*      (2006.01)

(52) U.S. Cl.
    CPC ...... *H01L 23/5226* (2013.01); *H01L 27/0924* (2013.01); *H01L 29/66795* (2013.01)

(58) Field of Classification Search
    CPC ....... H01L 29/78696; H01L 21/823418; H01L 21/823431; H01L 21/7682; H01L 21/76897; H01L 21/823481; H01L 23/5226; H01L 23/5286; H01L 27/0924
    USPC ........................................................ 257/506
    See application file for complete search history.

(56) References Cited

U.S. PATENT DOCUMENTS

| | | | |
|---|---|---|---|
| 2020/0365690 A1* | 11/2020 | Jeong | H01L 29/1608 |
| 2021/0098309 A1* | 4/2021 | Min | H01L 21/823481 |
| 2022/0319928 A1* | 10/2022 | Shen | H01L 21/823437 |

FOREIGN PATENT DOCUMENTS

| | | |
|---|---|---|
| KR | 20160147625 A | 12/2016 |
| KR | 20190015269 A | 2/2019 |
| KR | 20190024564 A | 3/2019 |
| KR | 20200008515 A | 1/2020 |
| KR | 20200050329 A | 5/2020 |
| WO | 2018004653 A1 | 1/2018 |

OTHER PUBLICATIONS

Su, Huan-Chieh et al., "Backside Power Rail and Methods of Forming the Same", U.S. Appl. No. 16/901,963 filed Jun. 15, 2020, Assignee Taiwan Semiconductor Manufacturing Co., Ltd., 28 pages specification, 22 pages drawings.

Chen, Chun-Yuan et al., "Anchor-Shaped Backside via and Method Thereof", U.S. Appl. No. 16/926,447, filed Jul. 10, 2020, Assignee Taiwan Semiconductor Manufacturing Co., Ltd., 32 pages specification, 16 pages drawings.

Chiang, Kuo Cheng, et al., "Semiconductor Devices with Backside Power Rail and Backside Self-Aligned via", U.S. Appl. No. 17/080,521, filed Oct. 25, 2020, Assignee Taiwan Semiconductor Manufacturing Co., Ltd., 37 pages specification, 24 pages drawings.

\* cited by examiner

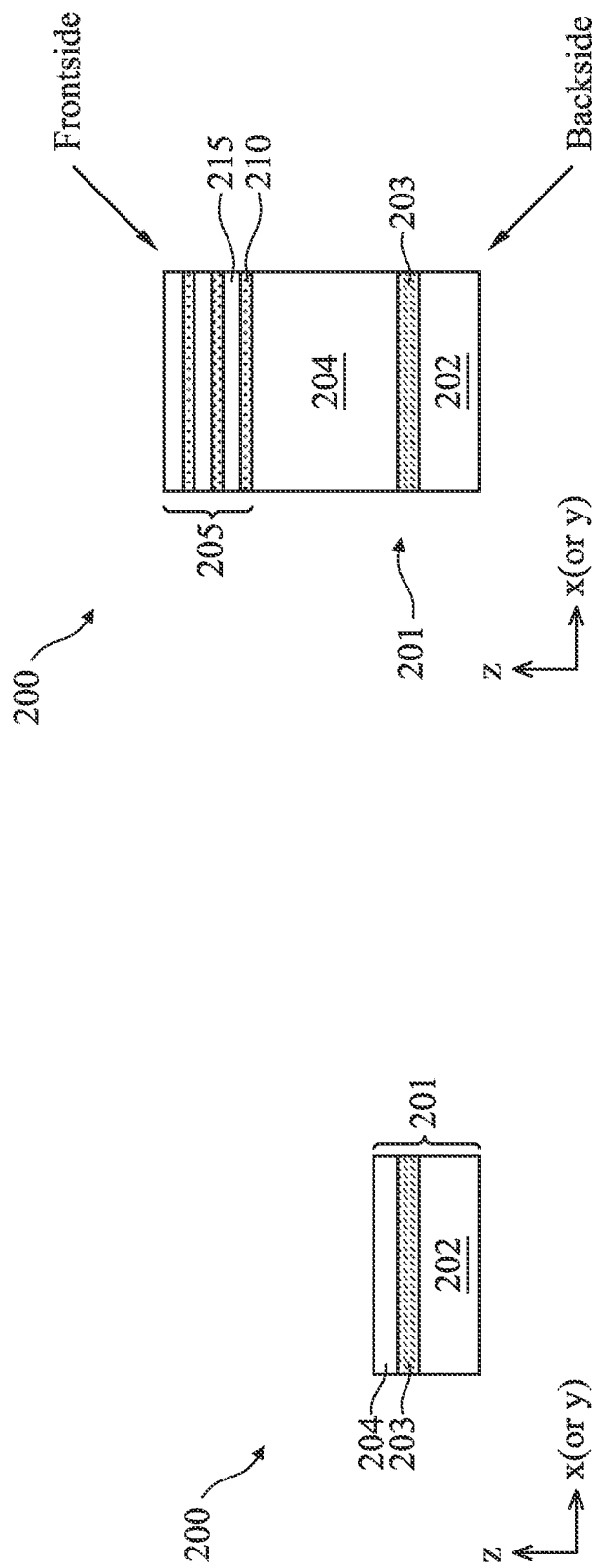

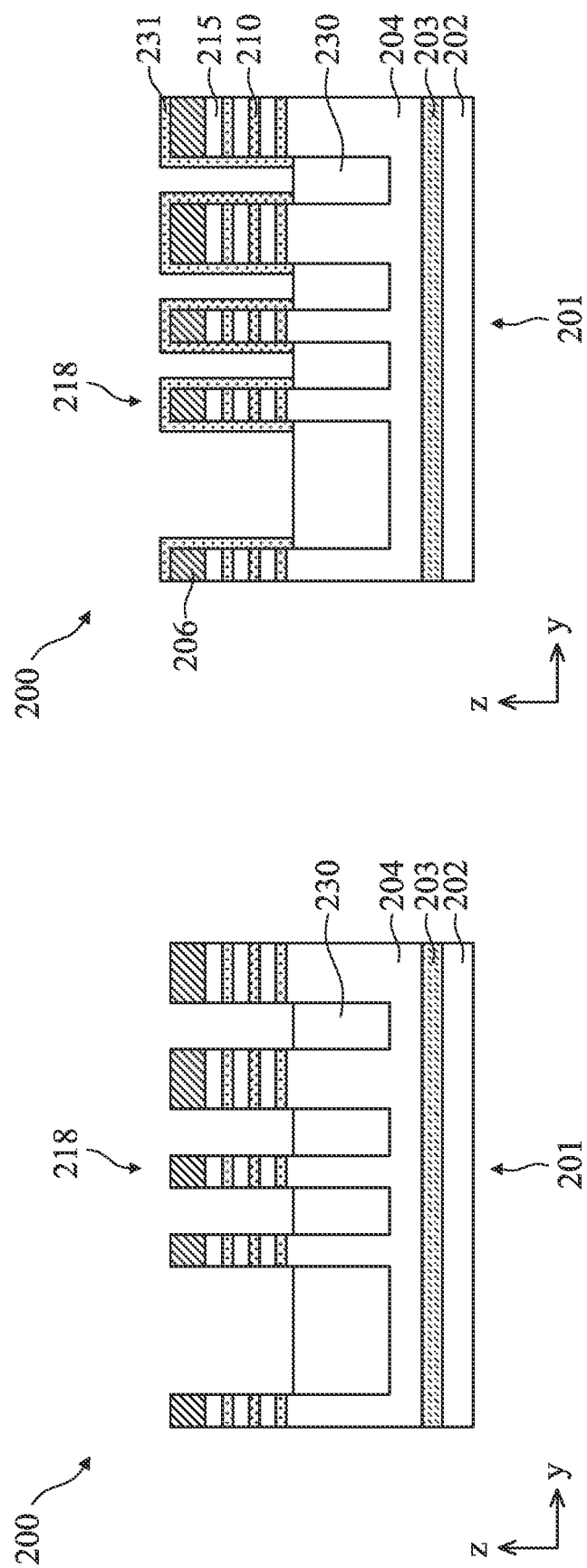

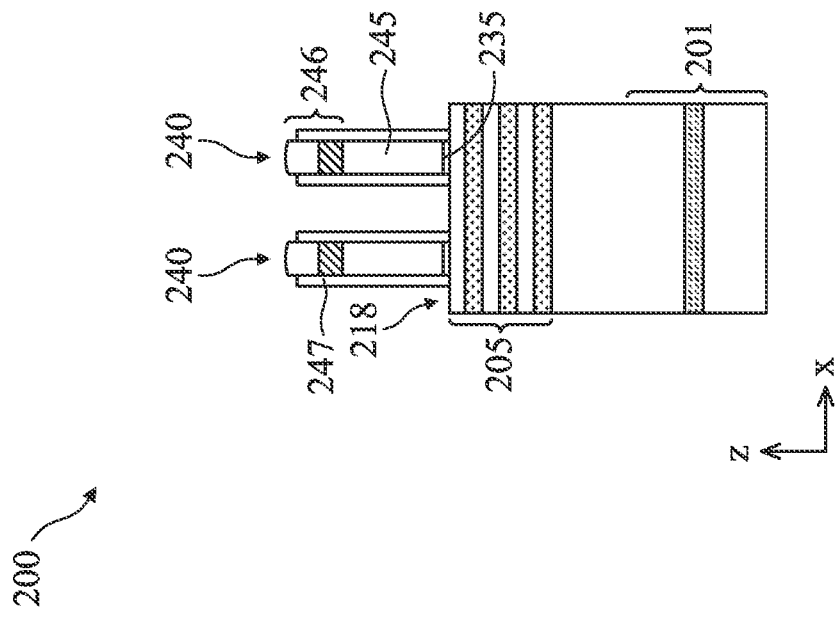
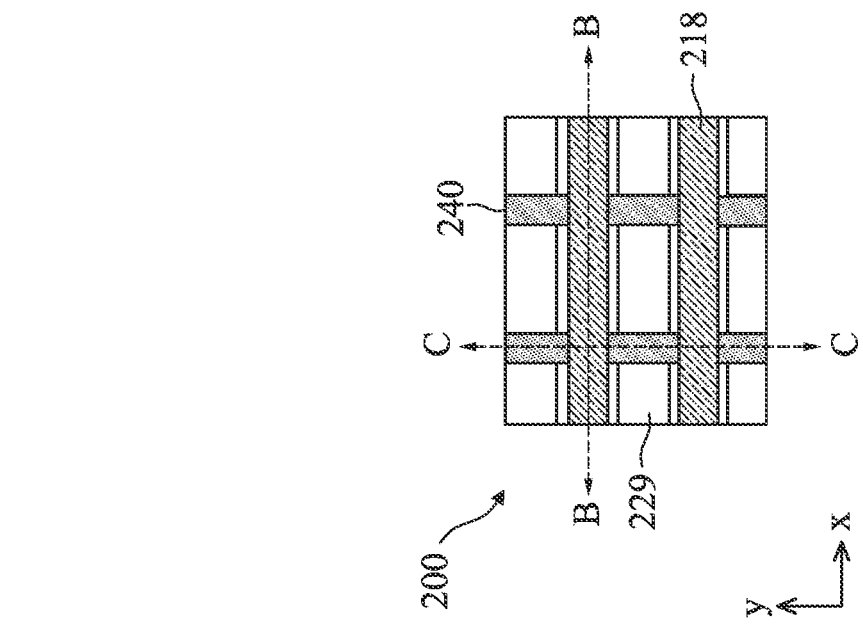
FIG. 13B
FIG. 13A

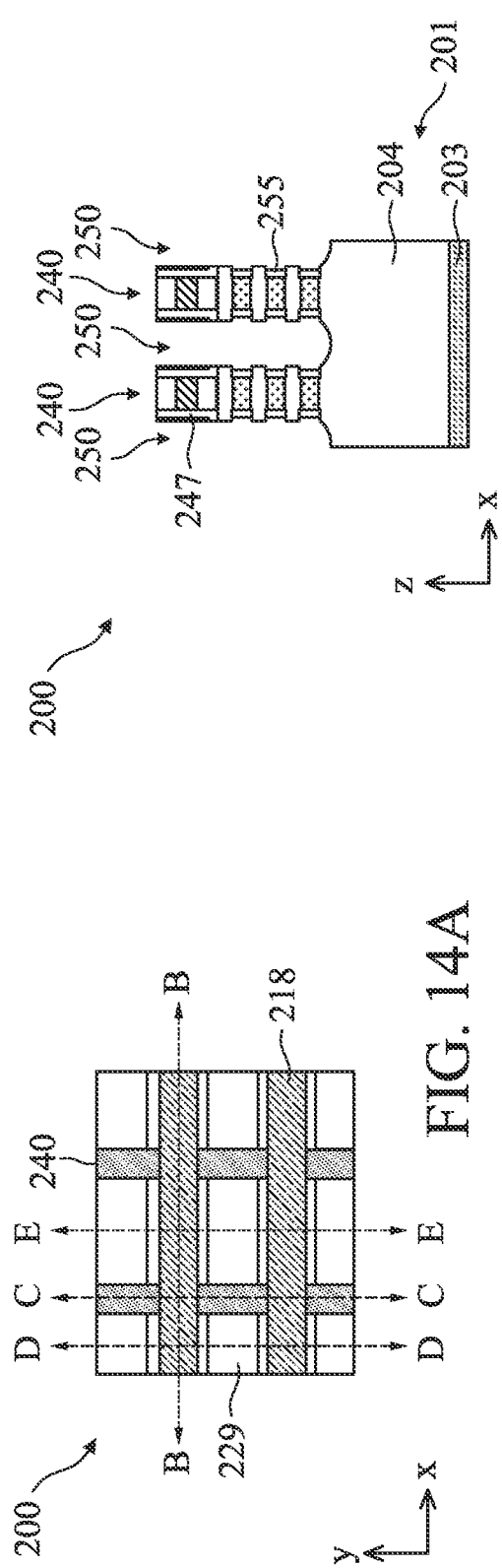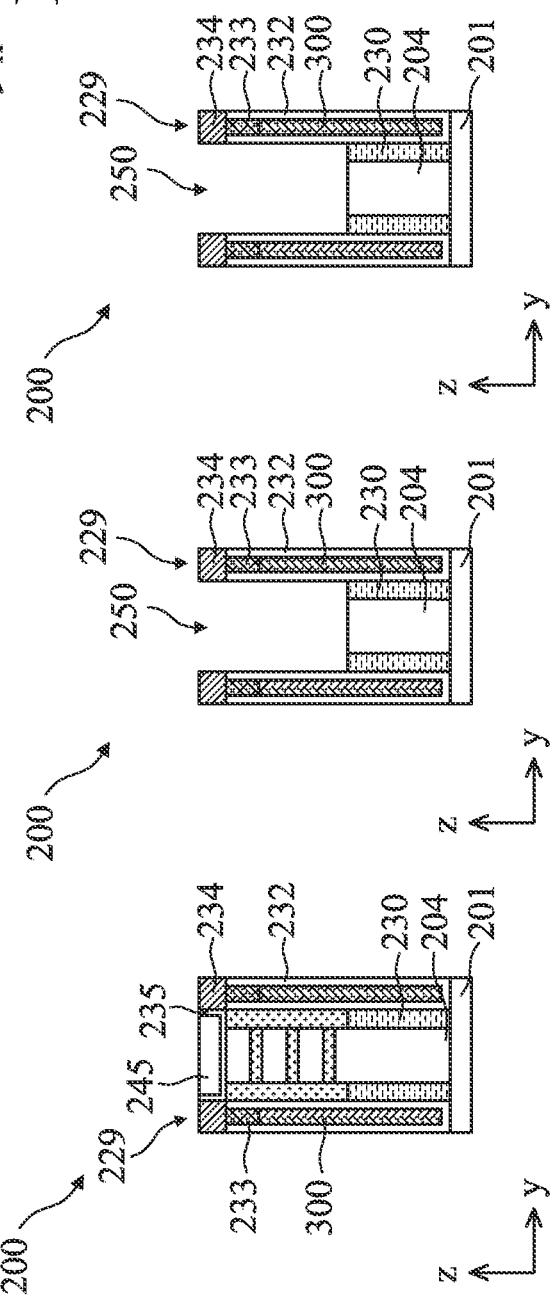

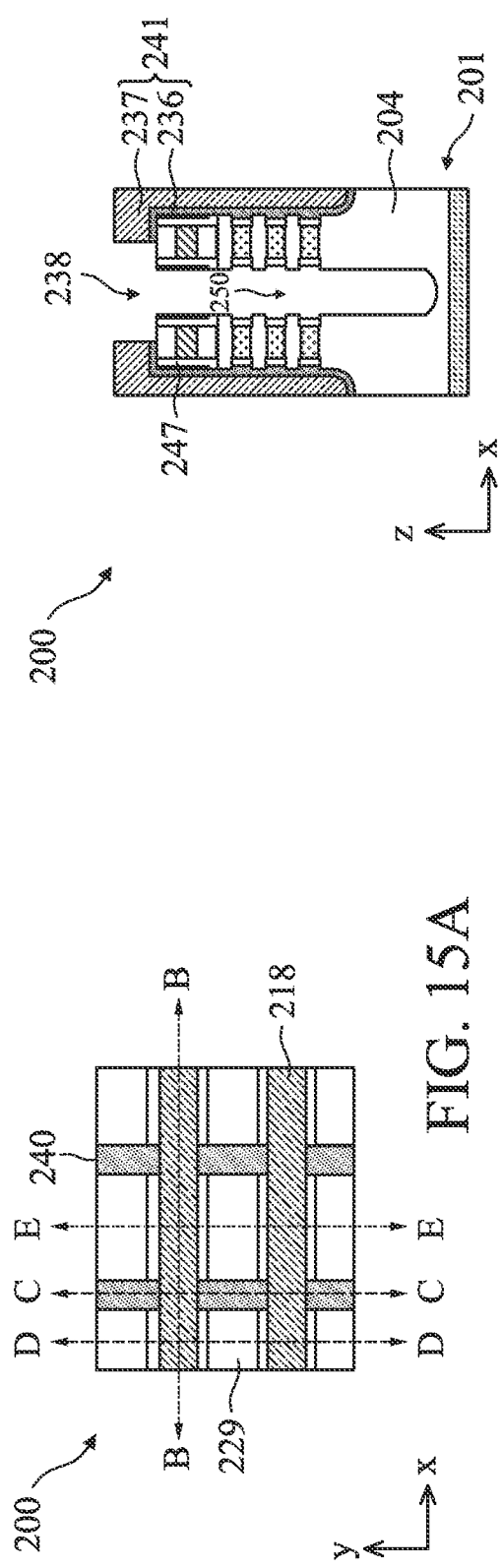

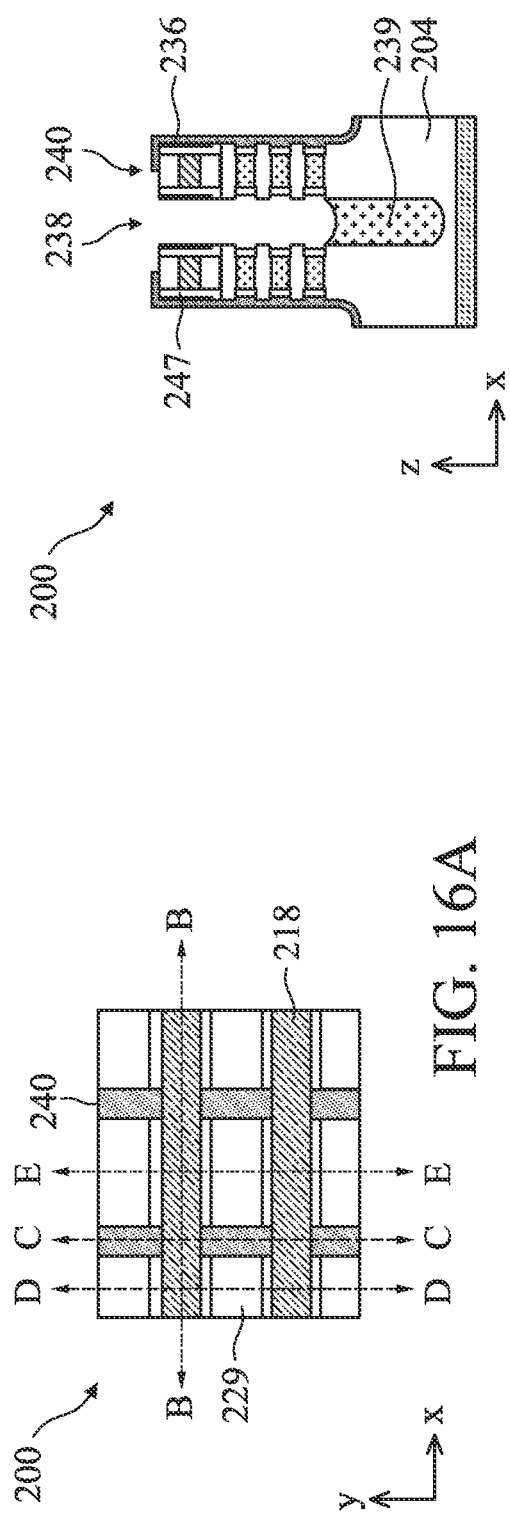

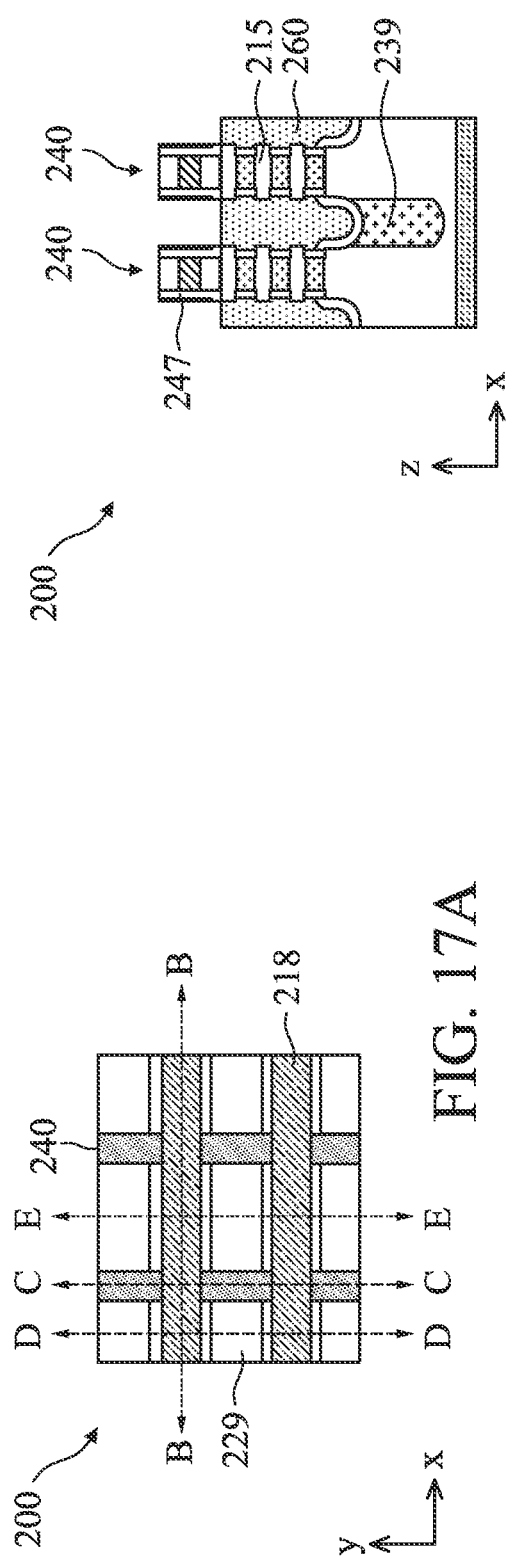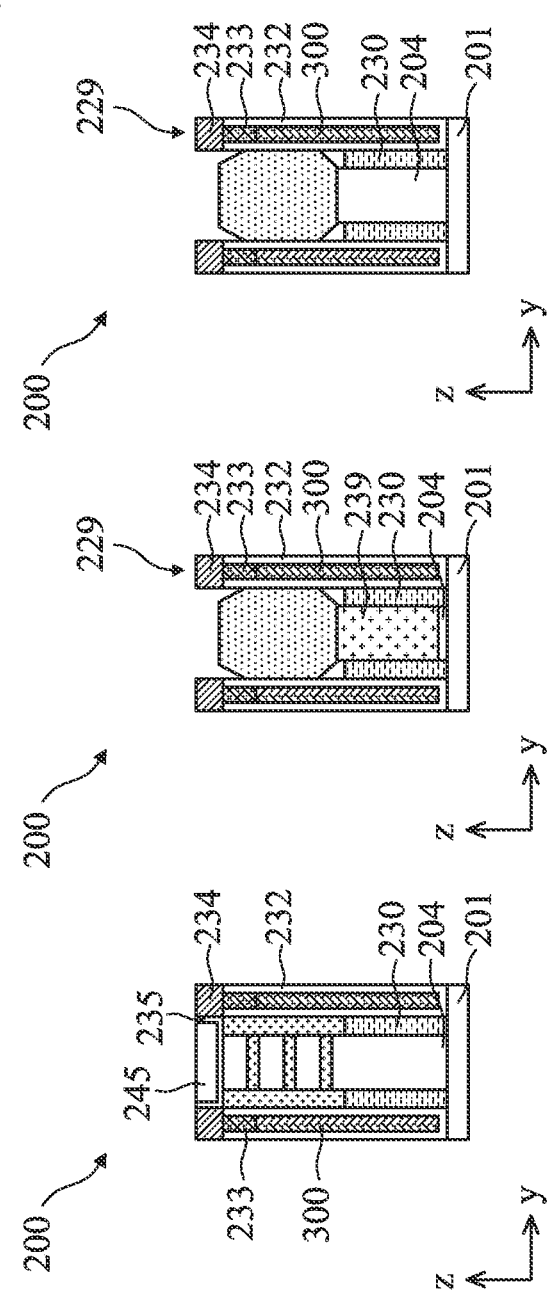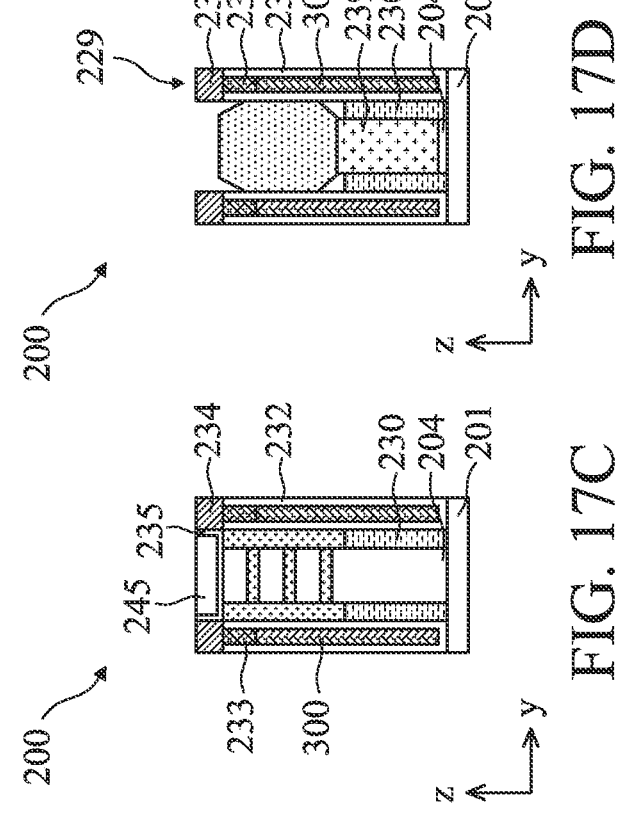
FIG. 17A  FIG. 17B  FIG. 17C  FIG. 17D  FIG. 17E

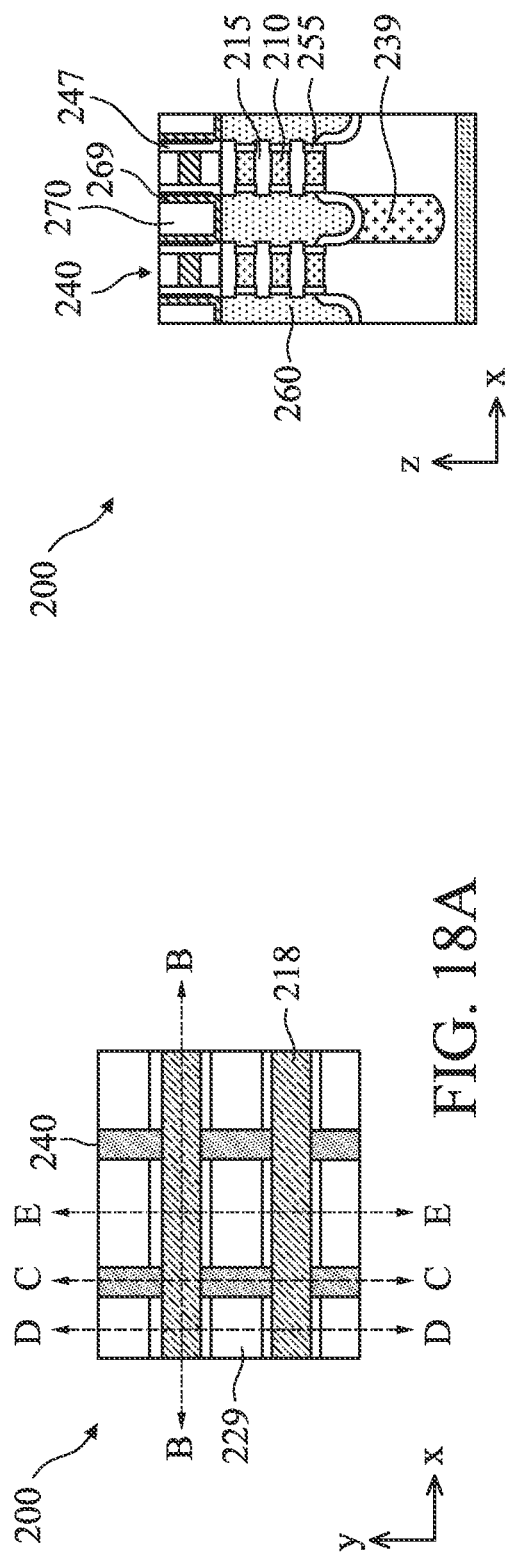
FIG. 18A
FIG. 18B
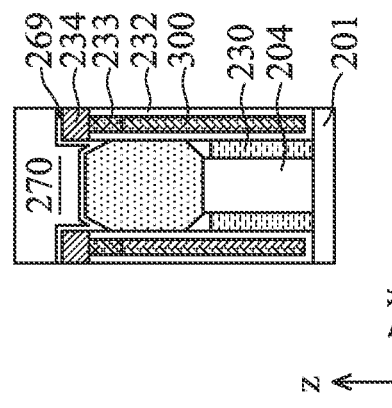
FIG. 18E
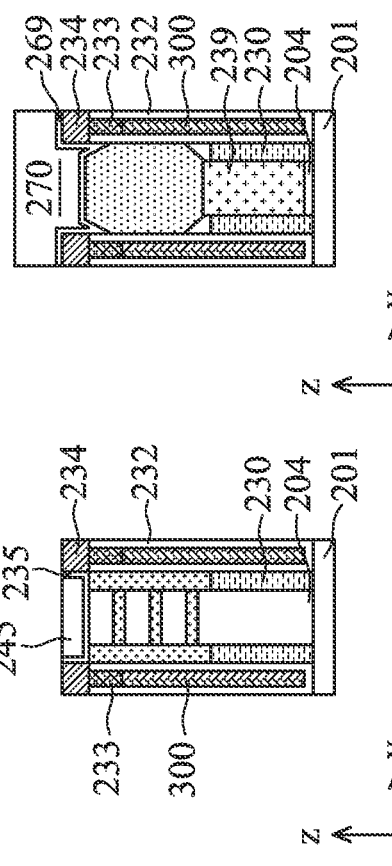
FIG. 18D
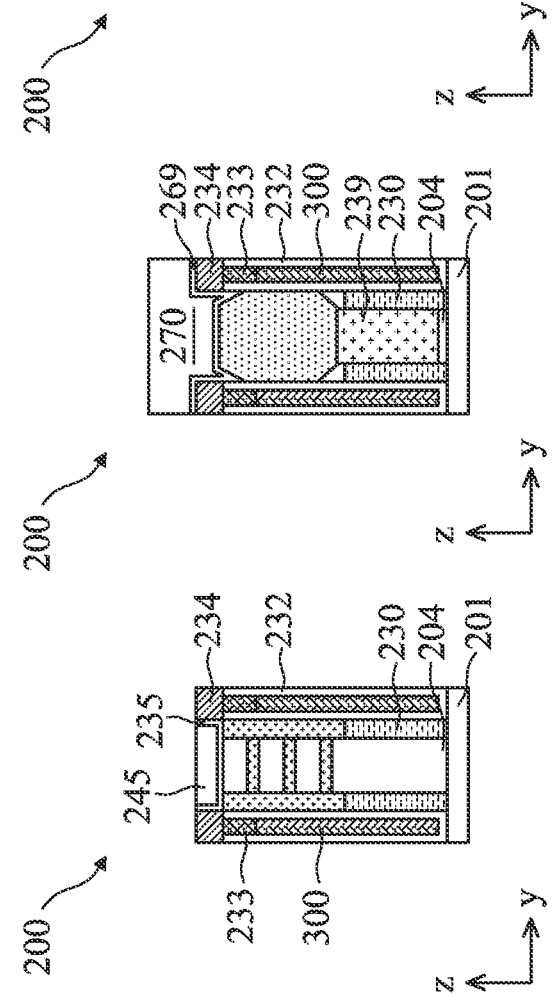
FIG. 18C

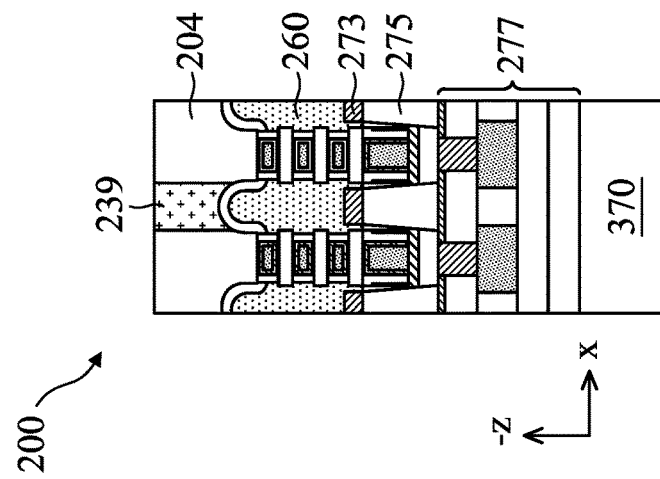
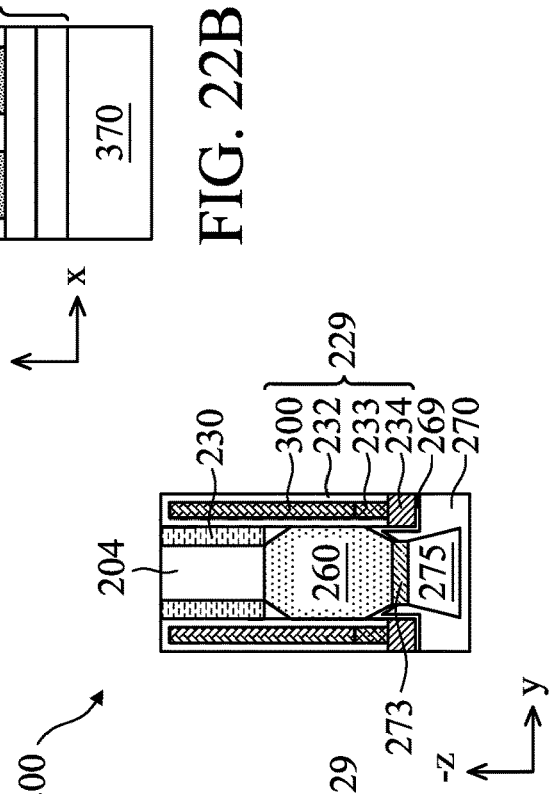
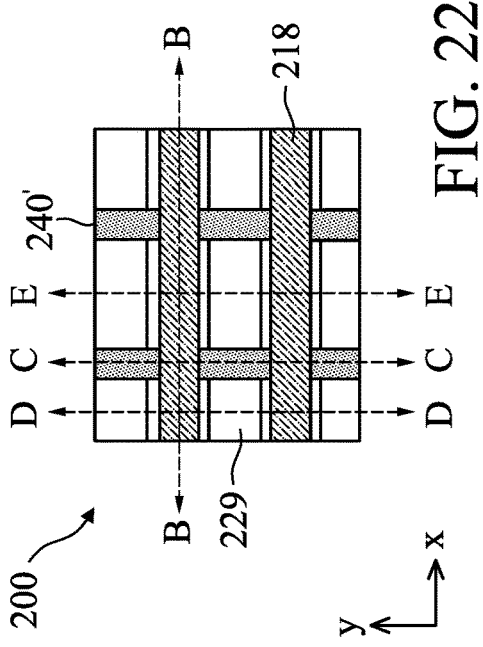
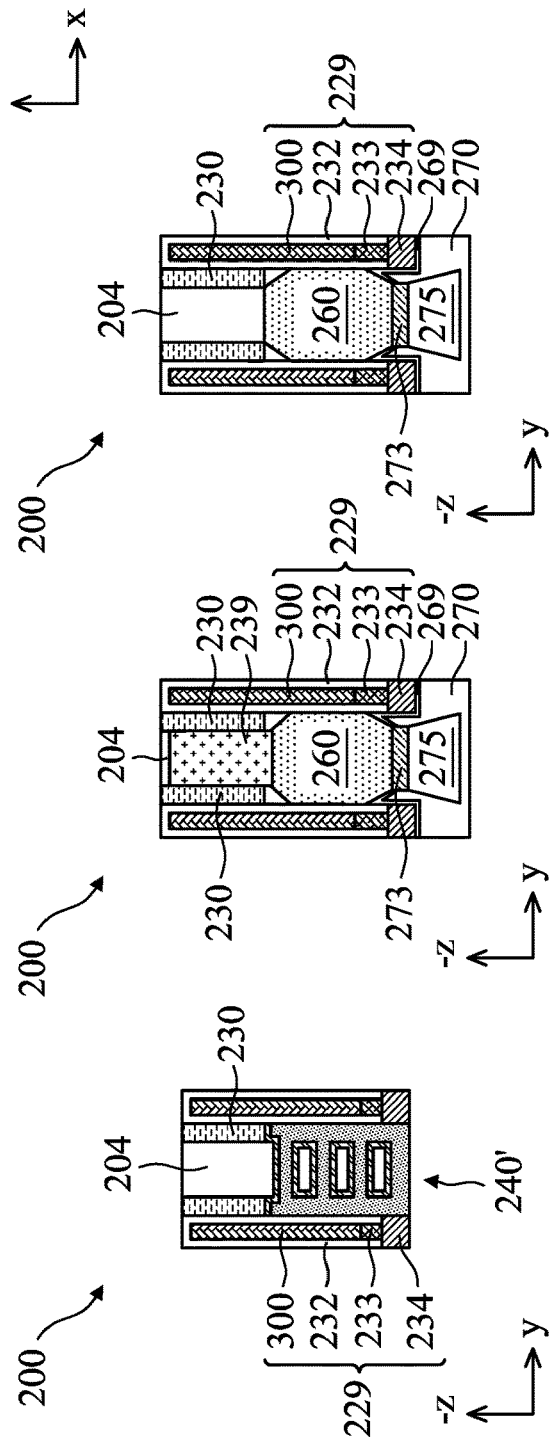
FIG. 22A
FIG. 22B
FIG. 22C
FIG. 22D
FIG. 22E

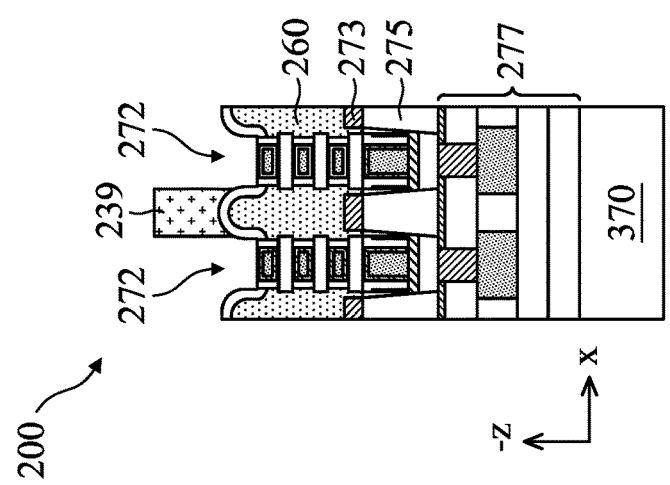
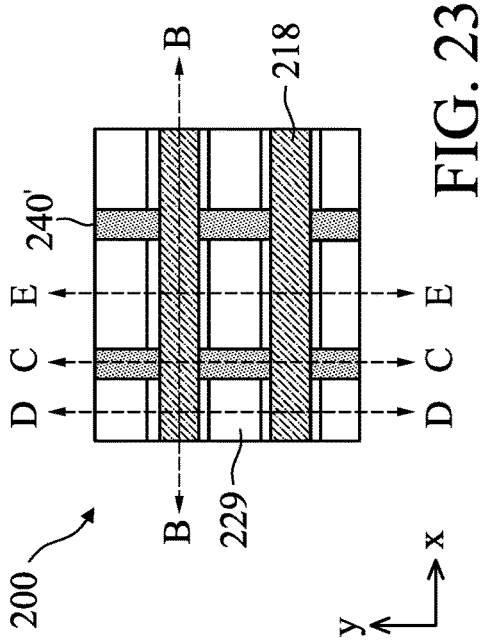
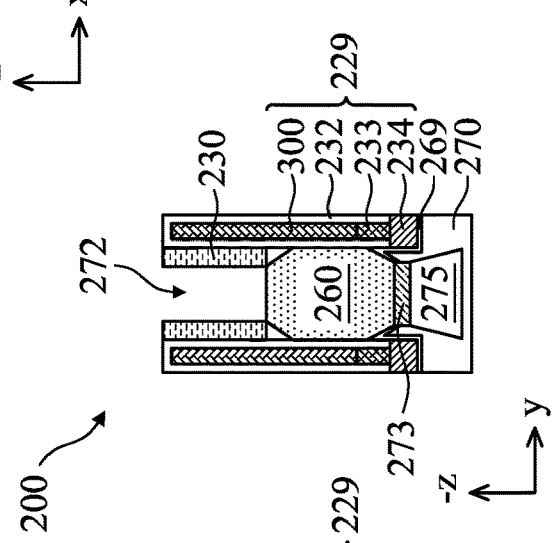
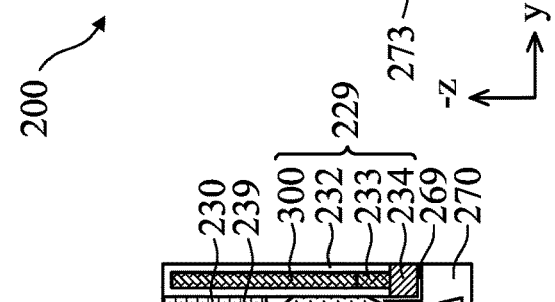
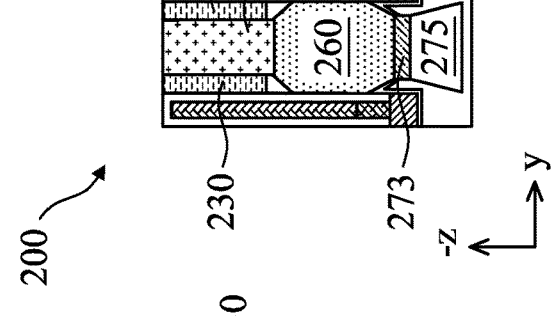
FIG. 23A
FIG. 23B
FIG. 23C
FIG. 23D
FIG. 23E

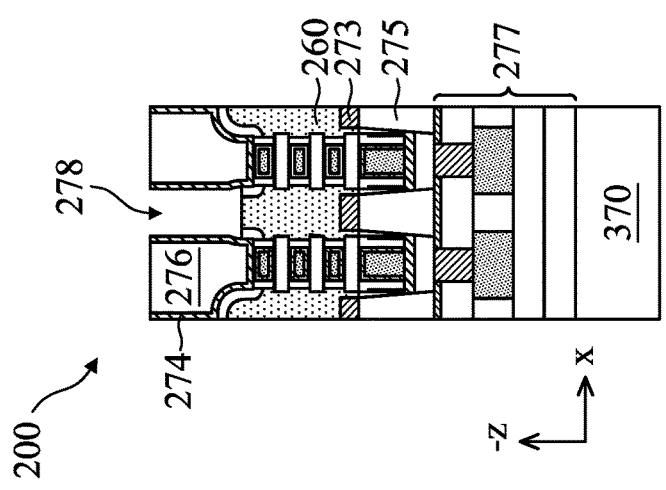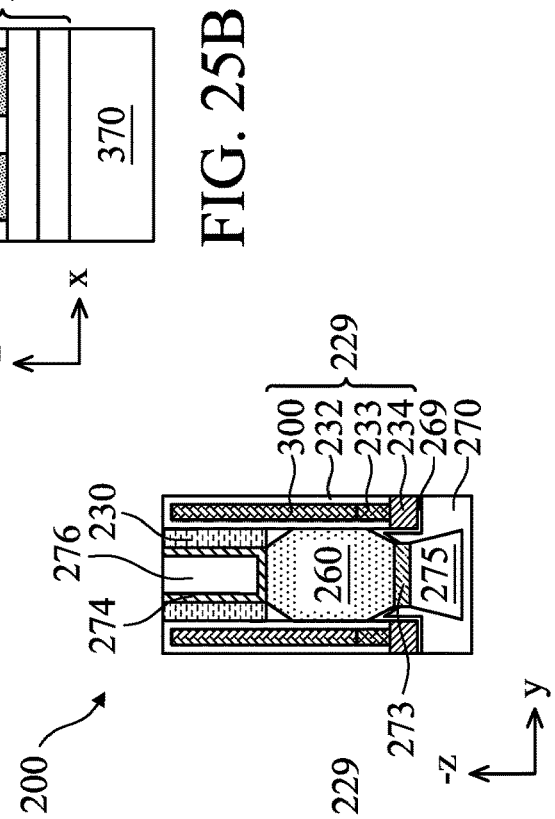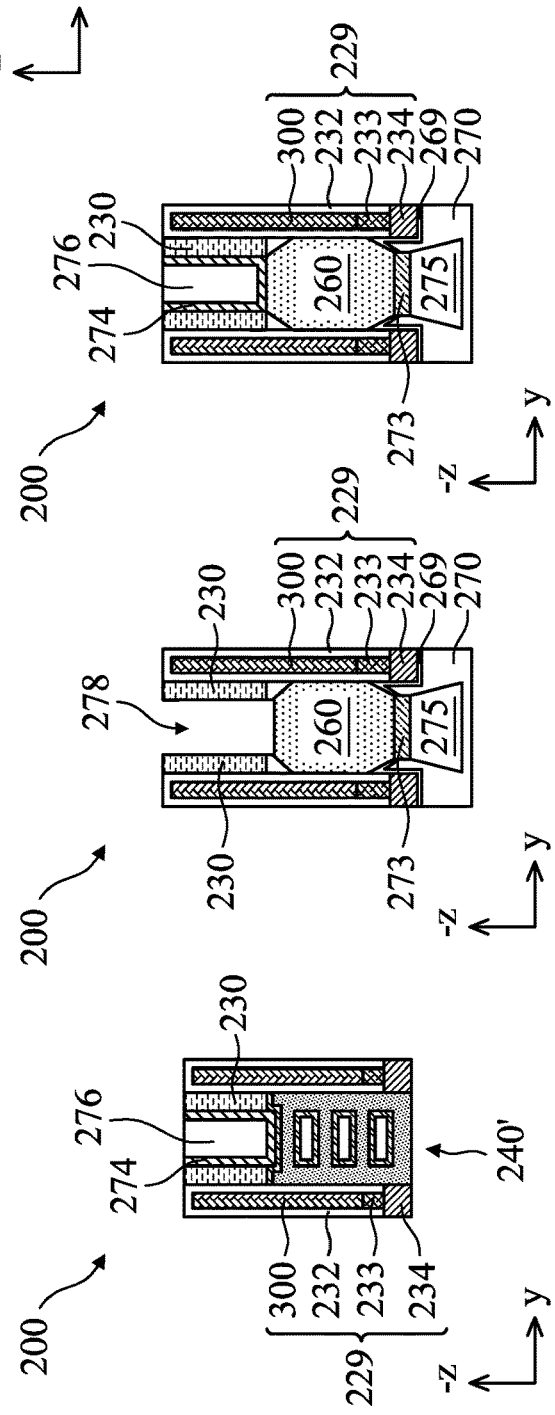
FIG. 25A
FIG. 25B
FIG. 25C
FIG. 25D
FIG. 25E

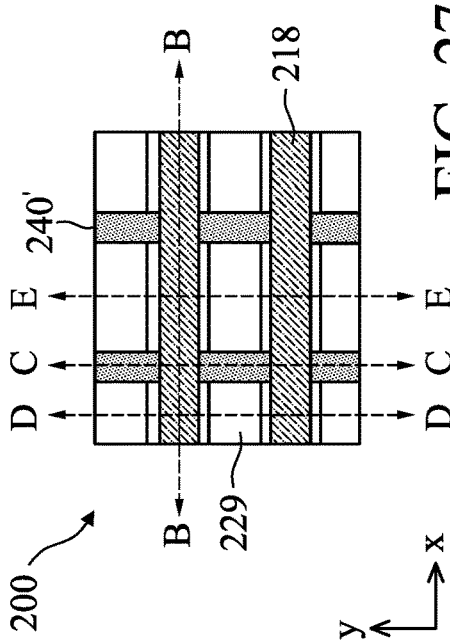
FIG. 27A
FIG. 27B
FIG. 27C
FIG. 27D
FIG. 27E

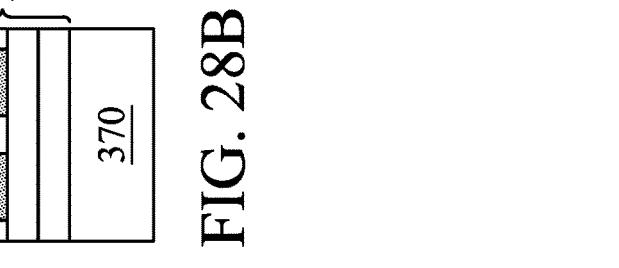
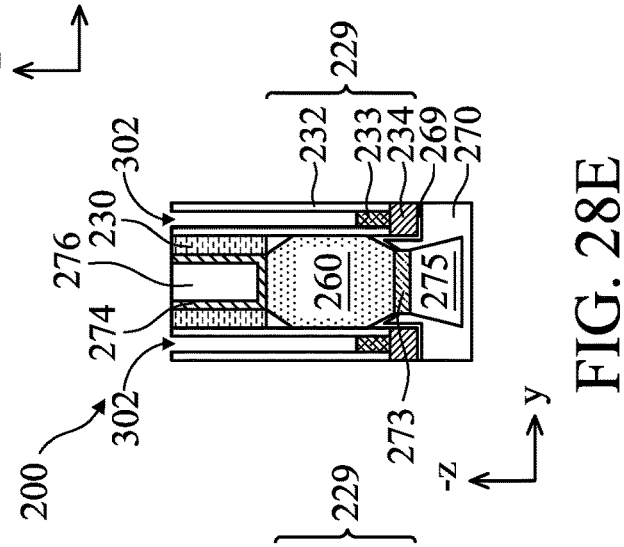
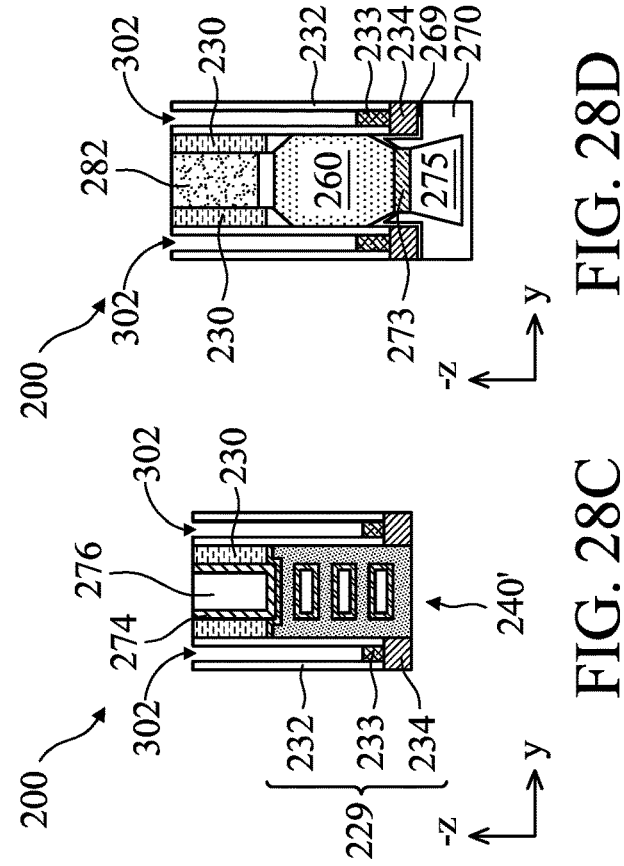
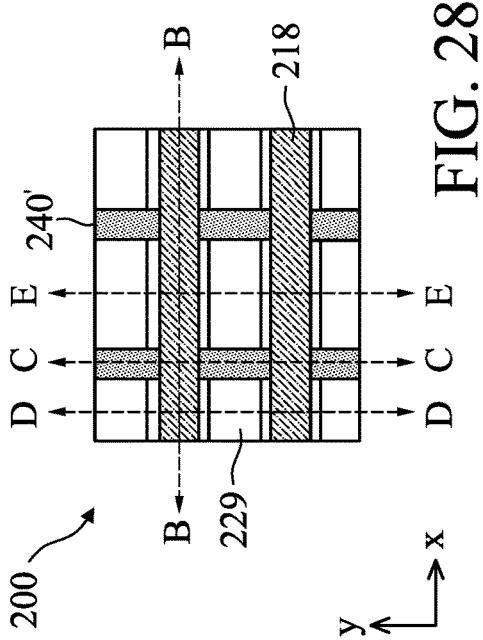
FIG. 28A
FIG. 28B
FIG. 28C
FIG. 28D
FIG. 28E

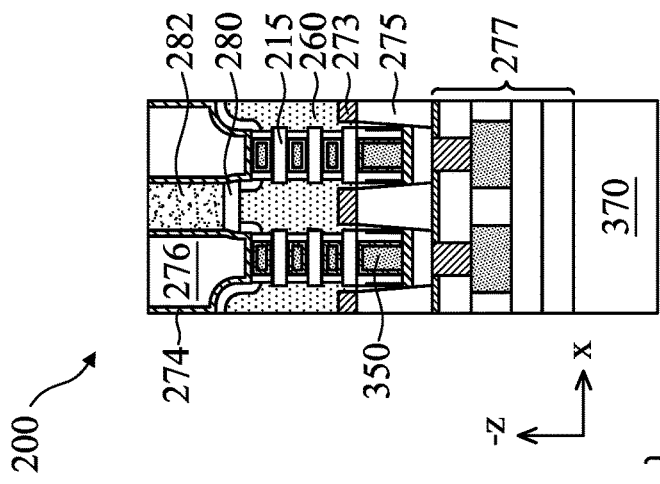
FIG. 29A
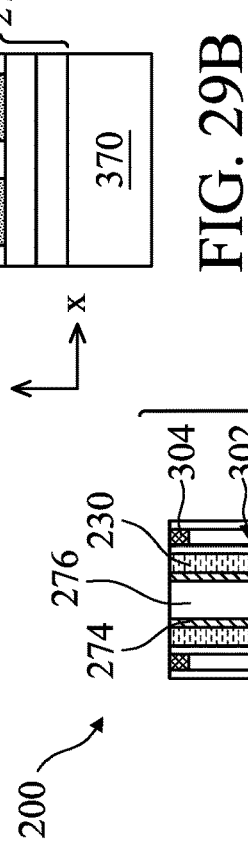
FIG. 29B
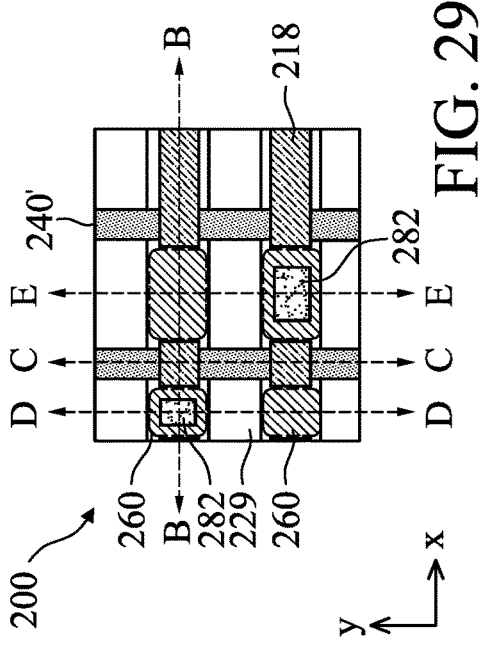
FIG. 29C
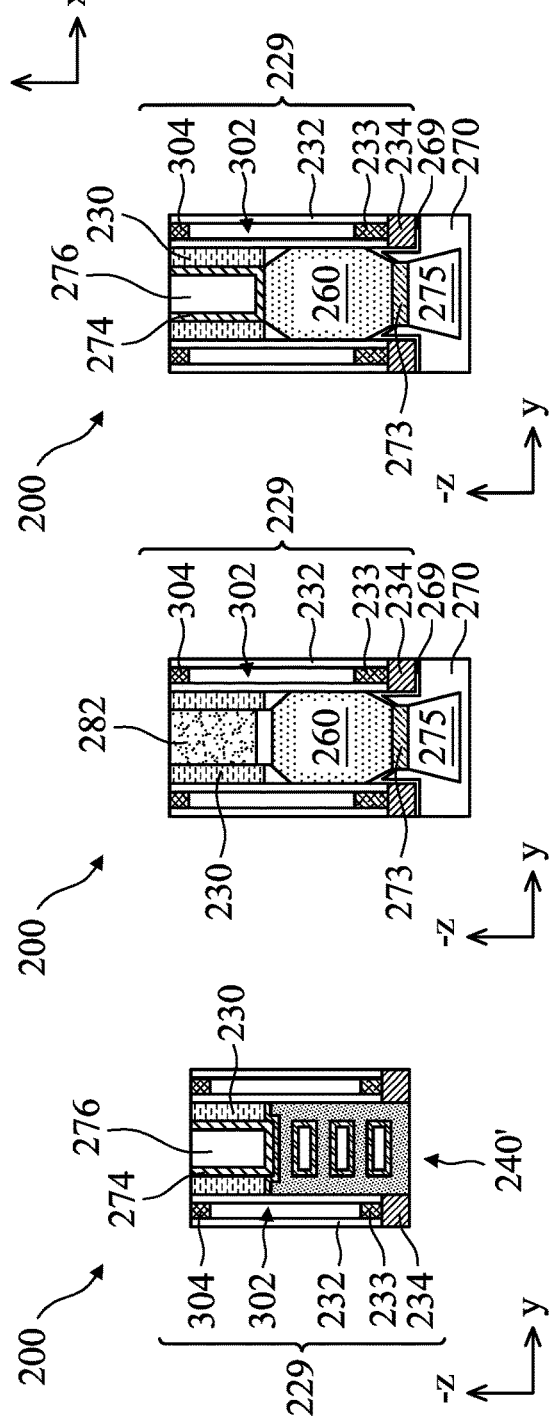
FIG. 29D
FIG. 29E

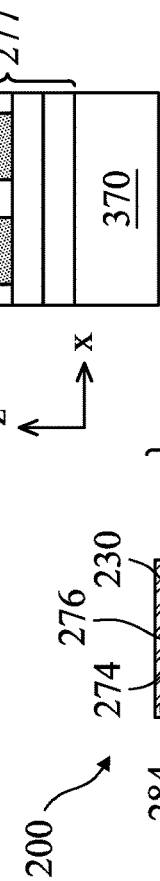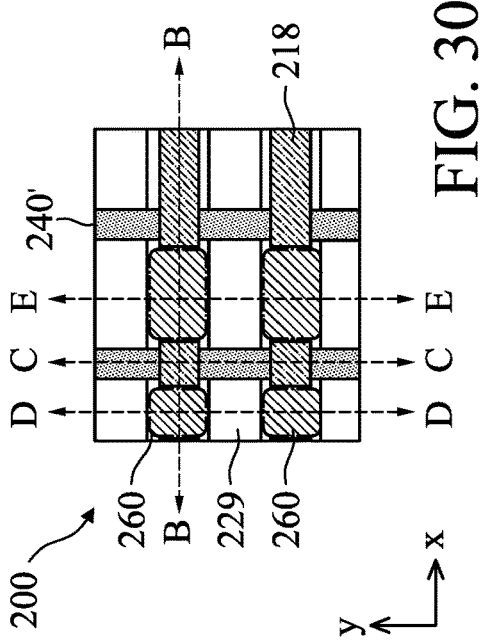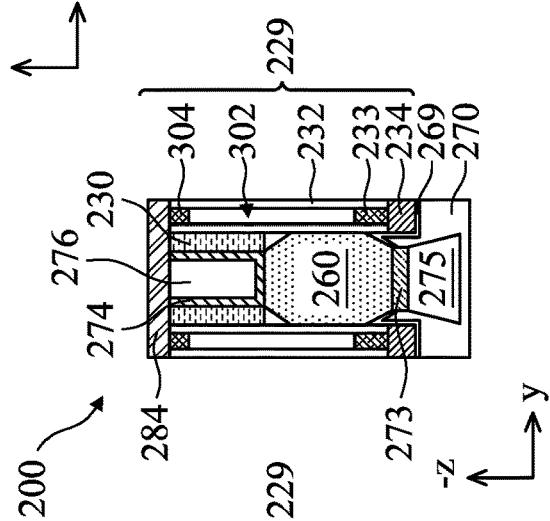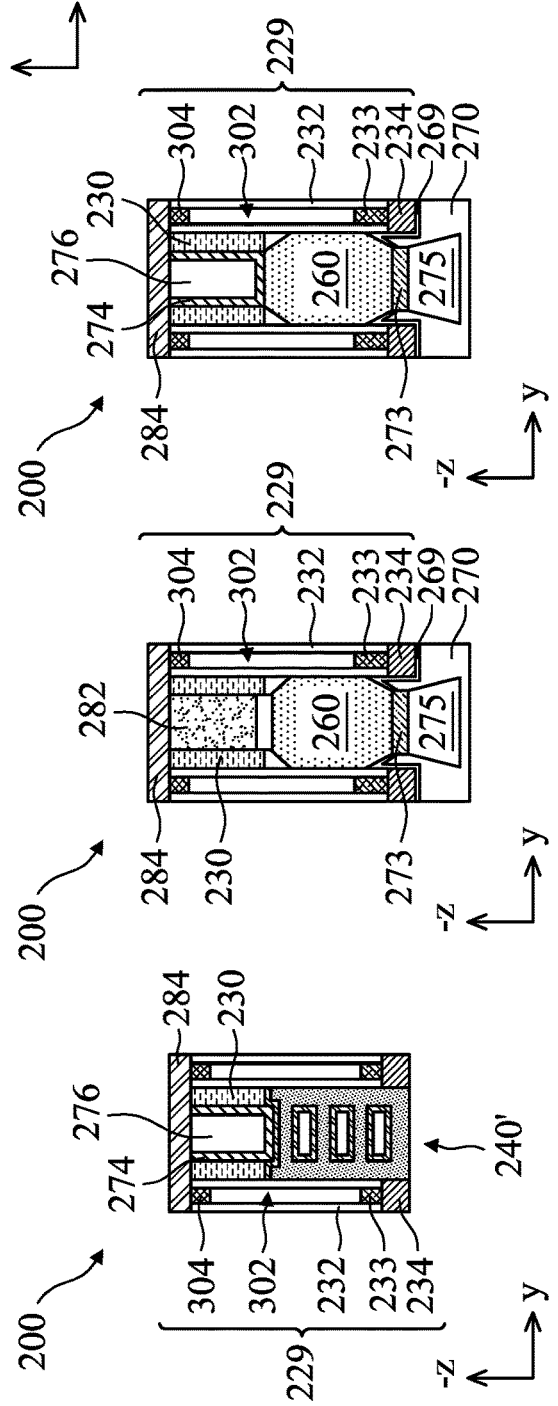
FIG. 30A  FIG. 30B  FIG. 30C  FIG. 30D  FIG. 30E

DIELECTRIC FINS WITH AIR GAP AND BACKSIDE SELF-ALIGNED CONTACT

PRIORITY

This claims the benefits to U.S. Provisional Application Ser. No. 63/032,365 filed May 29, 2020, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. One area of interests is how to isolate adjacent metal gate electrodes and how to isolate adjacent source/drain electrodes in highly integrated ICs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4B, 5, 6, 7, 8, 9, 10, 11, 12, 13B, 13C, 14B, 14C, 14D, 14E, 15B, 15C, 15D, 15E, 16B, 16C, 16D, 16E, 17B, 17C, 17D, 17E, 18B, 18C, 18D, 18E, 19B, 19C, 19C-1, 19C-2, 19C-3, 19C-4, 20B, 20C, 21, 22B, 22C, 22D, 22E, 23B, 23C, 23D, 23E, 24B, 24C, 24D, 24E, 25B, 25C, 25D, 25E, 26B, 26C, 26D, 26E, 27B, 27C, 27D, 27E, 28B, 28C, 28D, 28E, 29B, 29C, 29D, 29E, 30B, 30C, 30D, 30E, and 31 illustrate cross-sectional views of a portion of a semiconductor device, according to some embodiments, in intermediate steps of fabrication according to an embodiment of the method of FIGS. 1A-1D.

FIGS. 4A, 13A, 14A, 15A, 16A, 17A, 18A, 19A, 20A, 22A, 23A, 24A, 25A, 26A, 27A, 28A, 29A, and 30A illustrate top views of a portion of a semiconductor device, according to some embodiments.

DETAILED DESCRIPTION

Figure 1A:
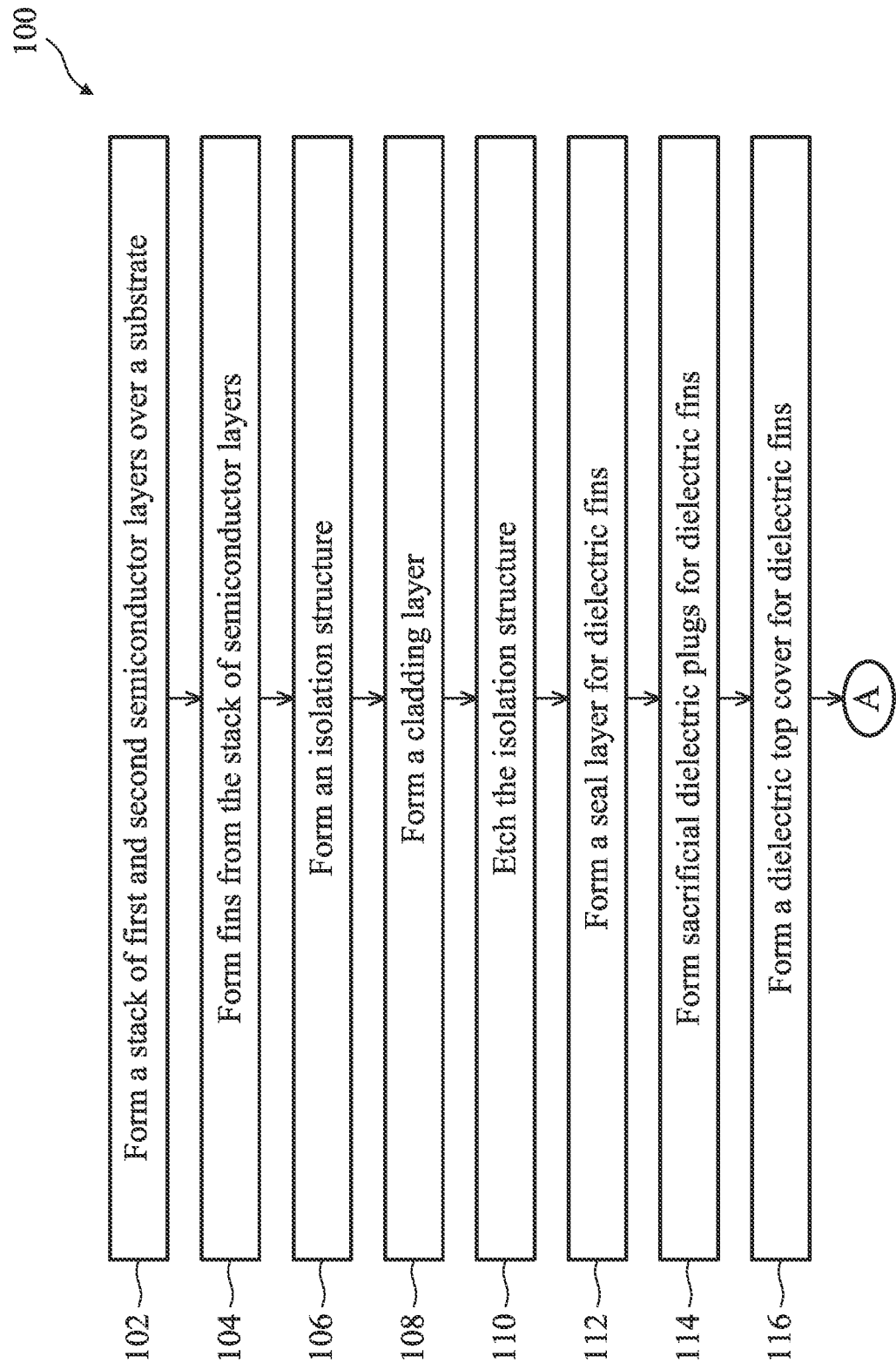
FIGS. 1A, 1B, 1C, and 1D show a flow chart of a method of forming a semiconductor device with backside power rails and backside self-aligned vias, according to various aspects of the present disclosure.
Figure 1B:
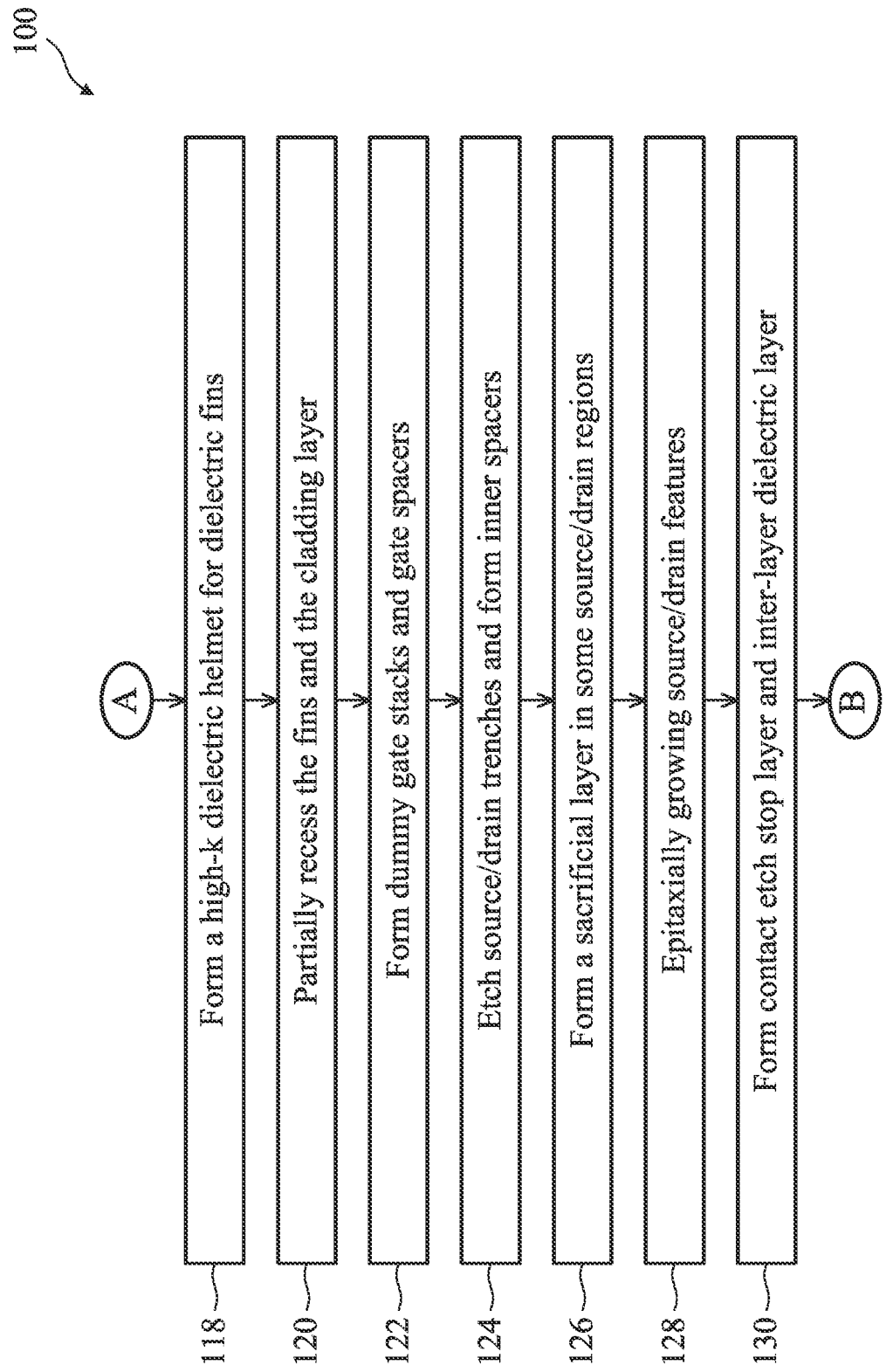
Figure 1C:
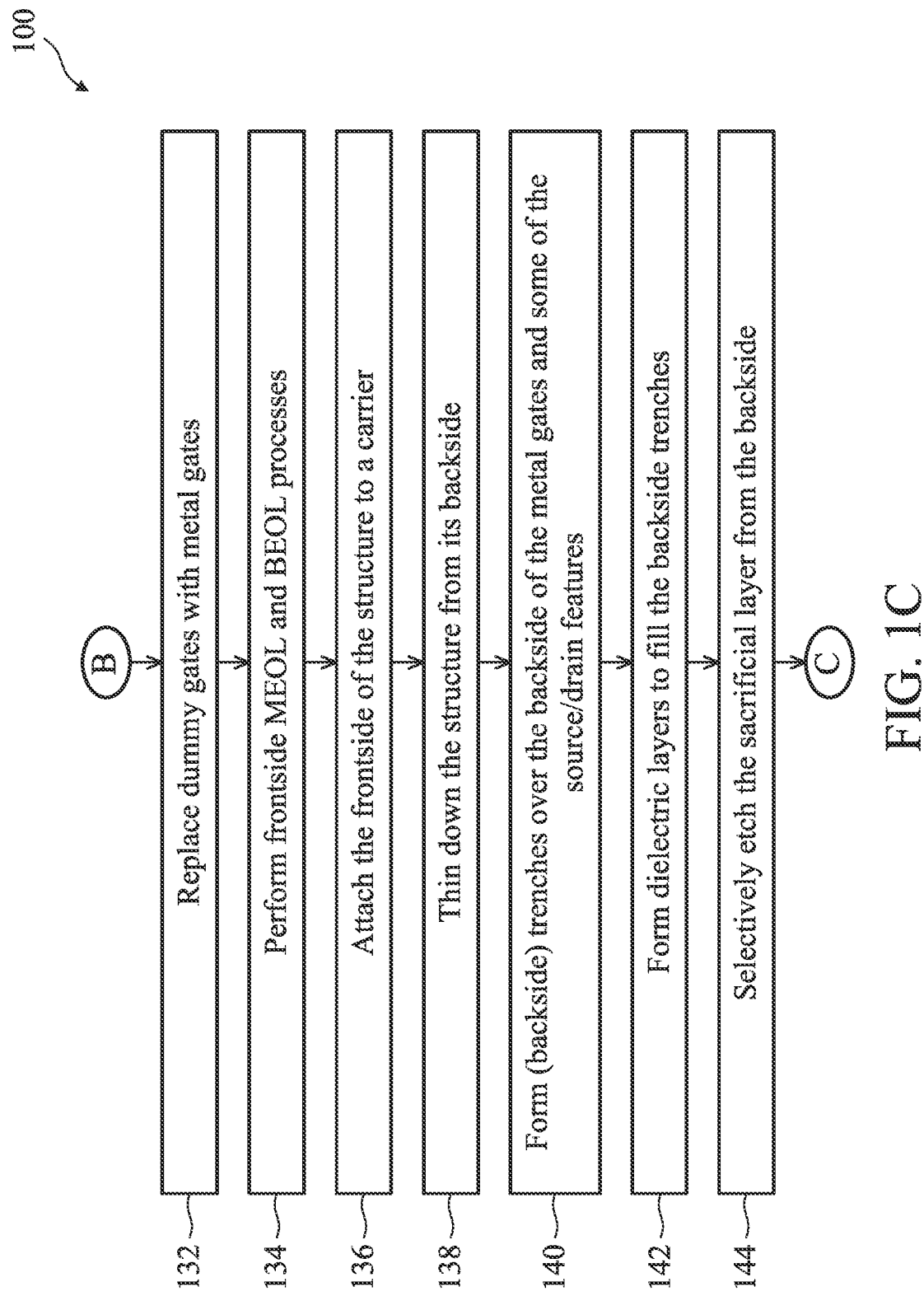
Figure 1D:
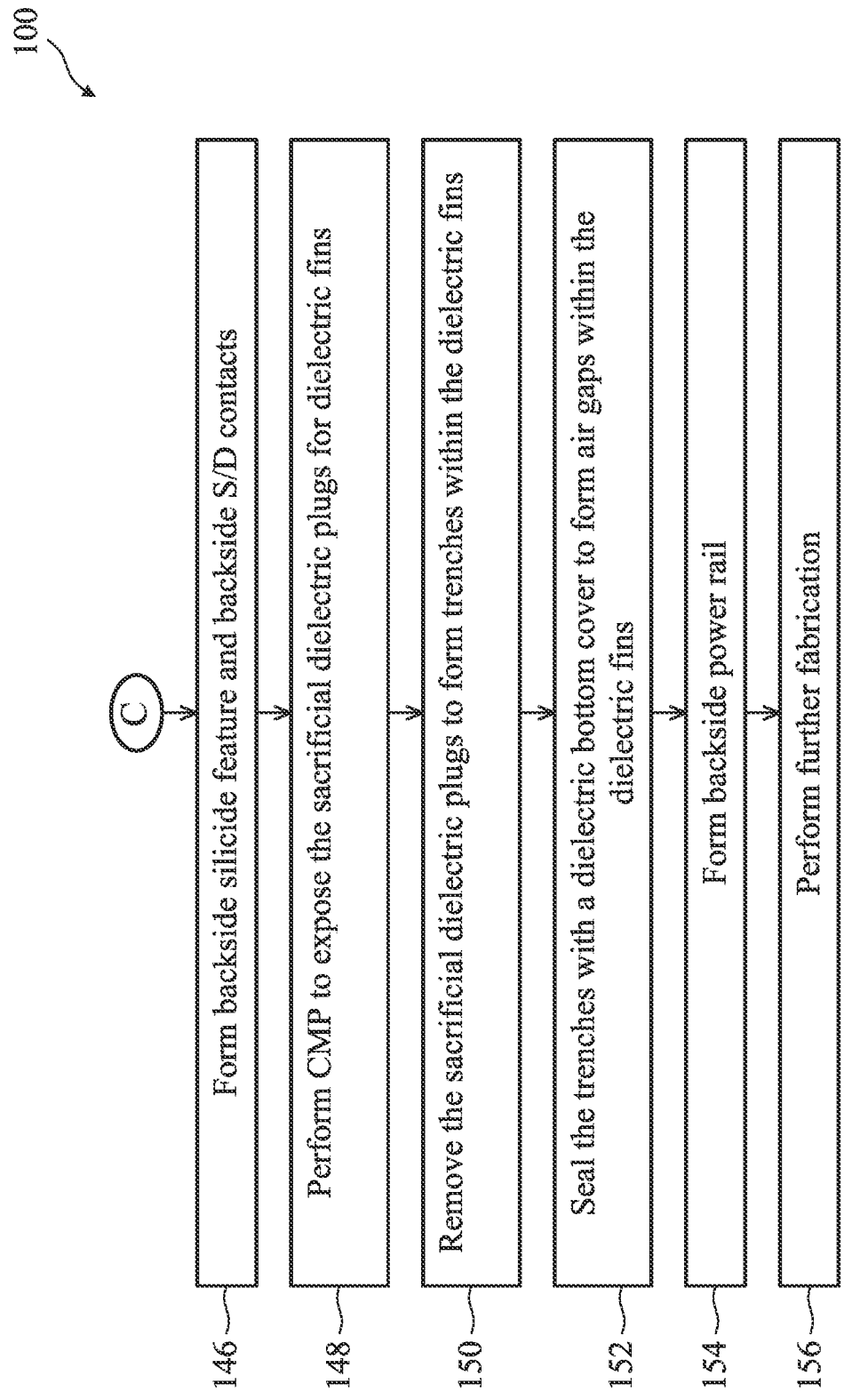

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to using dielectric fins with air gaps for isolating metal gates and isolating S/D features. The dielectric fins are formed by a combination of wafer frontside processes and wafer backside processes. For example, using wafer frontside processes, dielectric fins having a sacrificial layer are formed between adjacent semiconductor fins. During wafer backside processes for forming backside self-aligned contacts (or backside vias), this sacrificial layer is exposed and is selectively removed, and the space it formerly occupies is sealed off with a dielectric material, thereby forming air gaps within the dielectric fins. The air gaps further reduce coupling capacitance between adjacent metal gates.

The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. The present disclosure can also be utilized to make FinFET devices having backside power rail and backside self-aligned vias. For the purposes of simplicity, the present disclosure uses GAA devices as an example, and points out certain differences in the processes between GAA and FinFET embodiments. Those of ordinary skill in the art should appreciate that they may readily use the present disclosure as a basis for designing or modifying other processes and structures for carrying out the same purposes and/or achieving the same advantages of the embodiments introduced herein.

FIGS. 1A, 1B, 1C, and 1D are a flow chart of a method 100 for fabricating a semiconductor device according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2 through FIG. 31 that illustrate various top and cross-sectional views of a semiconductor device (or a semiconductor structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2 through 31 have been simplified for the sake of clarity to better understand the inventive concepts of the present disclosure. Additional features can be added in the device 200, and some of the features described below can be replaced, modified, or eliminated in other embodiments of the device 200.

Figures 19A, 19B, 19C:
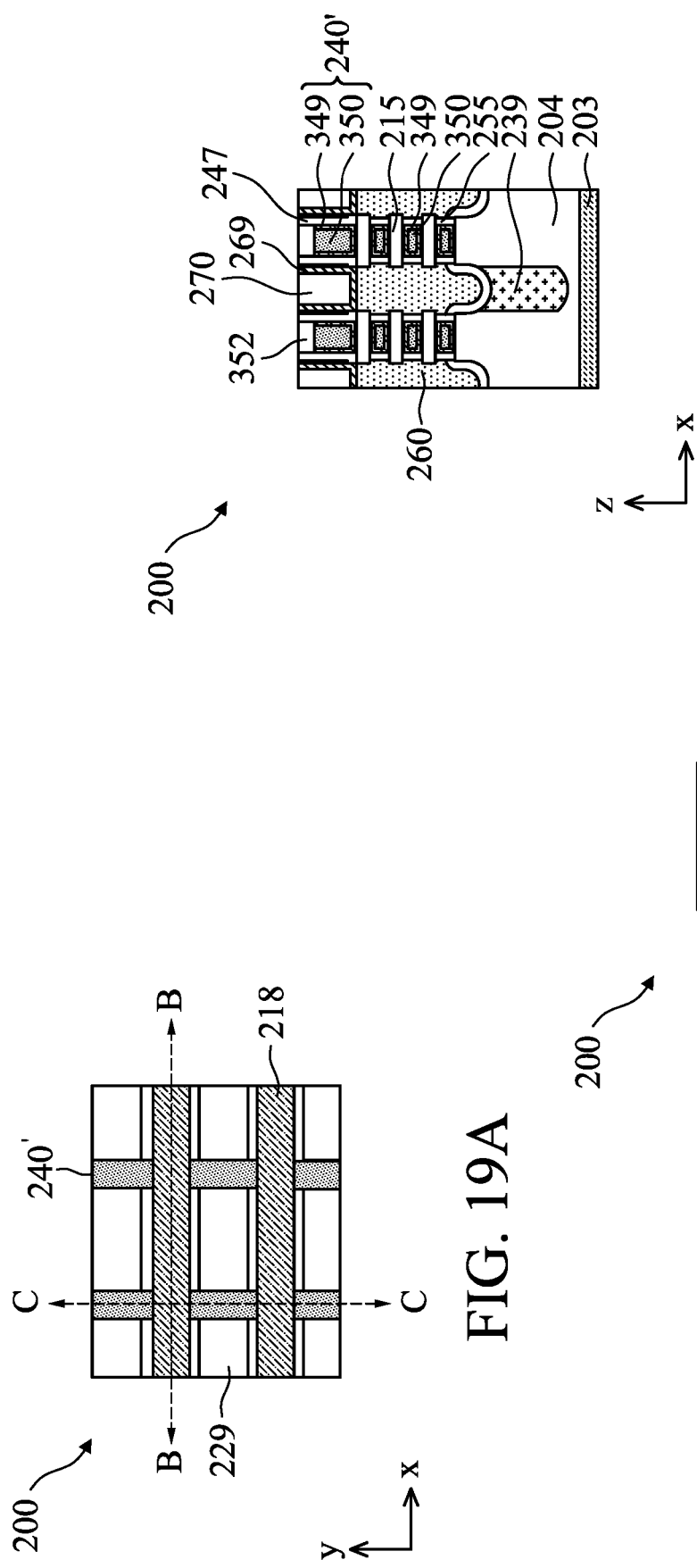

At operation 102, the method 100 (FIG. 1A) forms a stack 205 of first and second semiconductor layers over a substrate 201. The resultant structure is shown in FIGS. 2 and 3 according to an embodiment. Particularly, FIG. 2 illustrates the substrate 201 in an embodiment, and FIG. 3 illustrates a stack 205 of semiconductor layers 210 and 215 in an embodiment. In the depicted embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate. In the depicted embodiment, the substrate 201 includes a semiconductor layer 204, an insulator 203, and a carrier 202. In embodiments, the semiconductor layer 204 can be silicon, silicon germanium, germanium, or other suitable semiconductor; the carrier 202 may be part of a silicon wafer; and the insulator 203 may be silicon oxide. Semiconductor-on-insulator substrates can be fabricated using separation by implantation of oxygen (SIMOX), wafer bonding, and/or other suitable methods. In an alternative embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof.

In embodiments, the semiconductor layer 204 can be silicon, silicon germanium, germanium, or other suitable semiconductor, and may be undoped or unintentionally doped with a very low dose of dopants. The semiconductor layer stack 205 is formed over the substrate 201 and includes semiconductor layers 210 and semiconductor layers 215 stacked vertically (e.g., along the z-direction) in an interleaving or alternating configuration from a surface of the substrate 201. In some embodiments, semiconductor layers 210 and semiconductor layers 215 are epitaxially grown in the depicted interleaving and alternating configuration. For example, a first one of semiconductor layers 210 is epitaxially grown on substrate, a first one of semiconductor layers 215 is epitaxially grown on the first one of semiconductor layers 210, a second one of semiconductor layers 210 is epitaxially grown on the first one of semiconductor layers 215, and so on until semiconductor layers stack 205 has a desired number of semiconductor layers 210 and semiconductor layers 215. In some embodiments, epitaxial growth of semiconductor layers 210 and semiconductor layers 215 is achieved by a molecular beam epitaxy (MBE) process, a chemical vapor deposition (CVD) process (for example, vapor phase epitaxy (VPE) or ultra-high-vacuum (UHV) CVD), a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In some embodiments, semiconductor layers 210 have a first oxidation rate and semiconductor layers 215 have a second oxidation rate, where the second oxidation rate is less than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of the device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of the device 200. In the depicted embodiment, semiconductor layer stack 205 includes three semiconductor layers 210 and three semiconductor layers 215 configured to form three semiconductor layer pairs disposed over substrate 201, each semiconductor layer pair having a respective first semiconductor layer 210 and a respective second semiconductor layer 215. After undergoing subsequent processing, such configuration will result in the device 200 having three channels. However, the present disclosure contemplates embodiments where semiconductor layer stack 205 includes more or less semiconductor layers, for example, depending on a number of channels desired for the device 200 (e.g., a GAA transistor) and/or design requirements of the device 200. For example, semiconductor layer stack 205 can include two to ten semiconductor layers 210 and two to ten semiconductor layers 215. In an alternative embodiment where the device 200 is a FinFET device, the stack 205 is simply one layer of a semiconductor material, such as one layer of Si. As will be discussed, the method 100 will process layers at both sides of the substrate 201. In the present disclosure, the side of the substrate 201 where the stack 205 resides is referred to as the frontside and the side opposite the frontside is referred to as the backside.

Figure 4B:
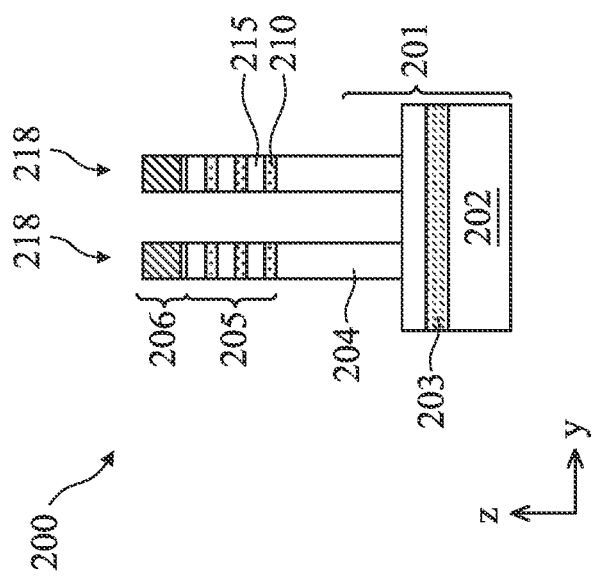
Figure 4A:
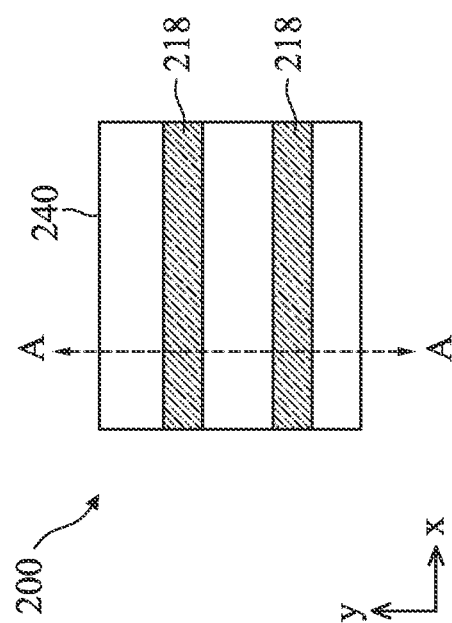

At operation 104, the method 100 (FIG. 1A) forms fins 218 by patterning the stack 205 and the substrate 201. FIG. 4A illustrates a top view of the device 200 with fins 218 oriented along the "x" direction. FIG. 4B illustrates a cross-sectional view of the device 200, in portion, along the A-A line in FIG. 4A. As illustrated in FIG. 4B, the fins 218 include the patterned stack 205 (having layers 210 and 215), patterned regions 204, and one or more patterned hard mask layers 206 (such as a silicon nitride hard mask). The fins 218 may be patterned by any suitable method. For example, the fin 218 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stack 205 and patterned using a photolithography process. Spacers are formed alongside the patterned sacrificial layer using a self-aligned process. The sacrificial layer is then removed, and the remaining spacers, or mandrels, may then be used as a masking element for patterning the fins 218. For example, the masking element may be used for etching recesses into the stack 205 and the substrate 201, leaving the fins 218 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 218 may be suitable.

From operation 106 through operation 120, the method 100 forms various isolation structures over the substrate 201 and isolating the fins 218, an embodiment of which is illustrated in FIGS. 5-12, which illustrate cross-sectional views of the device 200, in portion, along the A-A line in FIG. 4A at various steps of the method 100. These are further described below.

At operation 106, the method 100 (FIG. 1A) forms an isolation structure (or isolation feature(s)) 230 over and/or in substrate 201 to isolate various regions of the device 200, such as shown in FIG. 5. For example, isolation features 230 surround a bottom portion of fins 218 to separate and isolate fins 218 from each other. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures and/or deep trench isolation (DTI) structures. In an embodiment, the isolation features 230 can be formed by filling the trenches between fins 218 with insulator material (for example, by using a CVD process or a spin-on glass process), performing a chemical mechanical polishing (CMP) process to remove excessive insulator material and/or planarize a top surface of the insulator material layer, and etching back the insulator material layer to form isolation features 230. In some embodiments, isolation features 230 include a multi-layer structure, such as a silicon nitride layer disposed over a thermal oxide liner layer.

At operation 108, the method 100 (FIG. 1A) forms a cladding layer 231 over the top and sidewall surfaces of the fins 218 and above the isolation features 230. The resultant structure is shown in FIG. 6 according to an embodiment. In an embodiment, the cladding layer 231 includes SiGe. The cladding layer 231 may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), epitaxial growth methods, other suitable methods, or combinations thereof. After the cladding layer 231 is deposited, operation 106 performs an etching process to remove the portion of the cladding layer 231 from above the isolation features 230, for example, using a plasma dry etching process.

Figure 7:
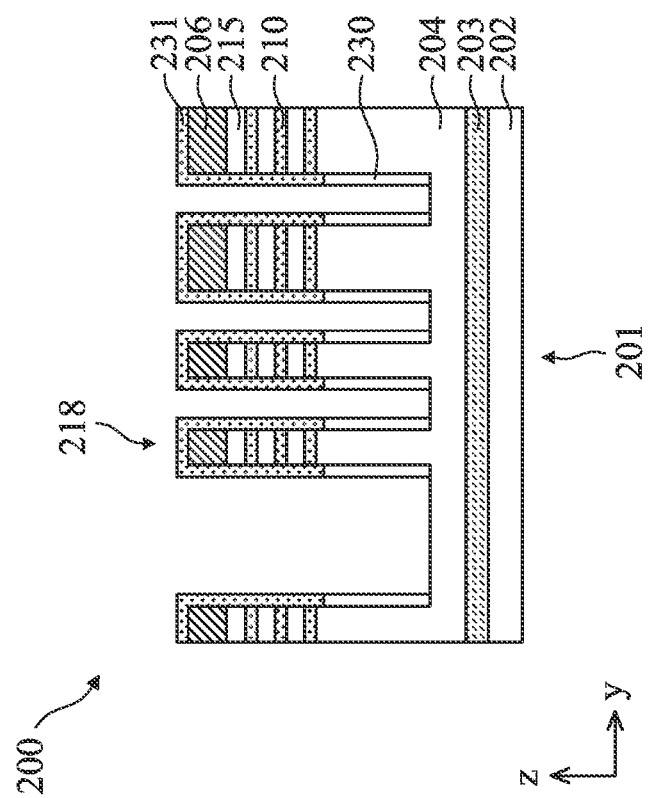

At operation 110, the method 100 (FIG. 1A) etches the isolation features 230 using the cladding layer 231 as an etch mask. The resultant structure is shown in FIG. 7 according to an embodiment. In the depicted embodiment, the isolation features 230 is etched until the semiconductor layer 204 of the substrate 201 is exposed. The operation 110 may apply one or more etching processes that are selective to the isolation features 230 and with no (or minimal) etching to the cladding layer 231. The etching processes can be dry etching, reactive ion etching, or other suitable etching methods and is anisotropic in the present embodiment.

Figure 8:
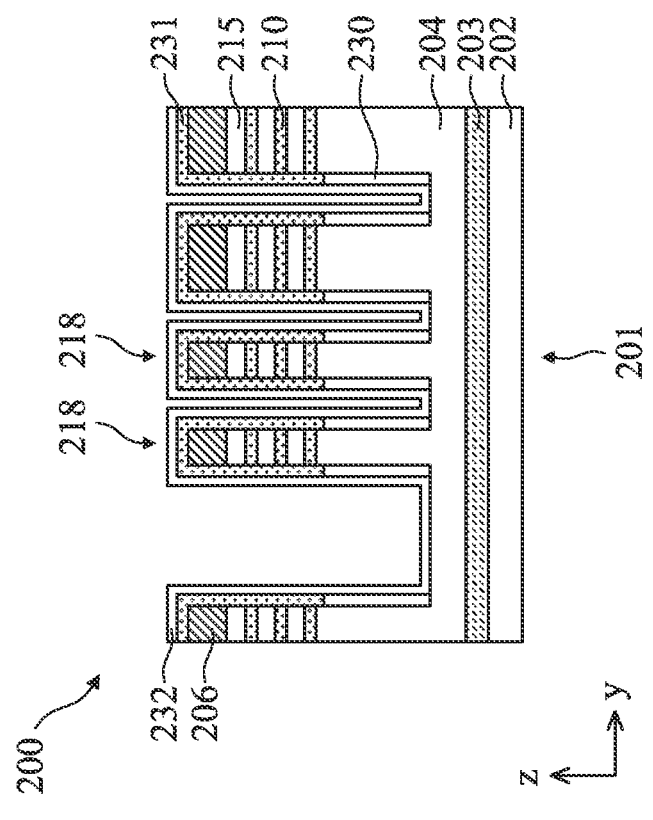

At operation 112, the method 100 (FIG. 1A) forms a seal layer (or dielectric seal layer or seal spacer) 232 over the surfaces of the cladding layer 231, the isolation features 230, and the substrate 201. The resultant structure is shown in FIG. 8 according to an embodiment. The seal layer 232 is part of dielectric fins to be formed for isolating adjacent S/D features and isolating adjacent metal gates. In some embodiments, the seal layer 232 includes a material that has etching selectivity with respect to the cladding layer 231 and the semiconductor layers 210 and 215 during subsequent fabrication steps. In some embodiments, the material in the seal layer 232 further has etching selectivity with respect to silicon nitride ($Si_3N_4$) and silicon oxide ($SiO_2$). In the present embodiment, the seal layer 232 includes silicon carbon nitride (SiCN). In alternative embodiments, the seal layer 232 includes a low-k dielectric material such as a dielectric material including Si, O, N, and C. Exemplary low-k dielectric materials include FSG, carbon doped silicon oxide, Xerogel, Aerogel, amorphous fluorinated carbon, Parylene, BCB, polyimide, or combinations thereof. Low-k dielectric material generally refers to dielectric materials having a low dielectric constant, for example, lower than 7.0. The seal layer 232 may be deposited using CVD, PVD, ALD, HDPCVD, MOCVD, RPCVD, PECVD, LPCVD, ALCVD, APCVD, other suitable methods, or combinations thereof. The seal layer 232 may have a substantially uniform thickness over the various surfaces in an embodiment. The seal layer 232 is desired to be very thin so that the dielectric fins of the present disclosure can provide low coupling capacitance between metal gates and between S/D features and that the seal layer 232 does not fully fill the space between adjacent fins 218, yet the seal layer 232 is desired to be thick enough to withstand various etching processes in subsequent fabrication steps including S/D trench etching process and channel release process. In some embodiments, the thickness of the seal layer 232 may be in a range of about 3 nm to about 15 nm, such as from about 5 nm to about 10 nm. If the thickness of the seal layer 232 is too small (such as less than 3 nm), it might not withstand the various etching processes in subsequent fabrication steps. If it was accidentally etched through, then air gaps might not be sealed in the dielectric fins of the present disclosure. If the thickness of the seal layer 232 is too big (such as more than 15 nm), the coupling capacitance provided by the dielectric fins of the present disclosure might be unnecessarily high.

Figures 9, 10:
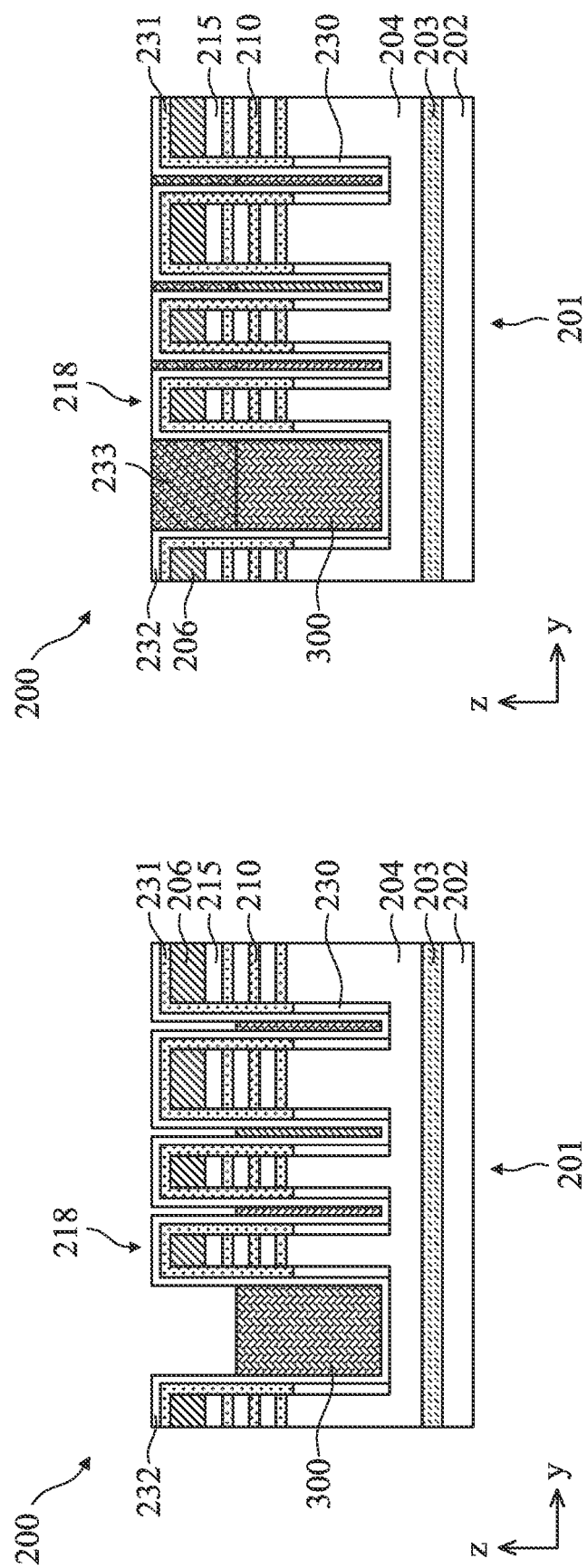

At operation 114, the method 100 (FIG. 1A) forms sacrificial dielectric plugs 300 over the seal layer 232 and in the space between the adjacent fins 218. The resultant structure is shown in FIG. 9 according to an embodiment. The sacrificial dielectric plugs 300 include a material that is easy to remove by an etching process (either a wet etching or a dry etching) and has high etch selectivity with respect to the seal layer 232, the isolation features 230, metals (such as metals having very low resistance), silicon nitride, and silicon dioxide. In an embodiment, the sacrificial dielectric plugs 300 include silicon germanium. The sacrificial dielectric plugs 300 may be deposited using CVD, PVD, ALD, HDPCVD, MOCVD, RPCVD, PECVD, LPCVD, ALCVD, APCVD, other suitable methods, or combinations thereof. In the present embodiment, one or more materials are deposited over the seal layer 232 and overfill the space between the adjacent fins 218. Then, the one or more materials are etched back to a level that is below the bottom surface of the topmost semiconductor 215. The remaining portion of the one or more materials becomes the sacrificial dielectric plugs 300, such as shown in FIG. 9. The sacrificial dielectric plugs 300 are part of the dielectric fins initially and will be removed (for example, during wafer backside processing) to form air gaps.

At operation 116, the method 100 (FIG. 1A) forms a dielectric top cover 233 over the seal layer 232 and the sacrificial dielectric plugs 300 and filling the gaps between the adjacent fins 218. The dielectric top cover 233 is part of dielectric fins to be formed for isolating adjacent S/D features and isolating adjacent metal gates. In some embodiments, the dielectric top cover 233 includes a material that has high etching selectivity with respect to the seal layer 232, the sacrificial dielectric plugs 300, the cladding layer 231, and the fin hard mask 206 during subsequent fabrication steps. In some embodiments, the material in the dielectric top cover 233 further has etching selectivity with respect to silicon nitride ($Si_3N_4$), silicon, silicon germanium, and high-k dielectric materials. In the present embodiment, the dielectric top cover 233 includes silicon dioxide ($SiO_2$), tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric top cover 233 may be deposited using CVD, PVD, ALD, HDPCVD, MOCVD, RPCVD, PECVD, LPCVD, ALCVD, APCVD, flowable CVD, other suitable methods, or combinations thereof. After the dielectric top cover 233 is deposited, the operation 116 may perform a CMP process to planarize the top surface of the device 200 and to expose the seal layer 232 or to expose the cladding layer 231.

Figure 11:
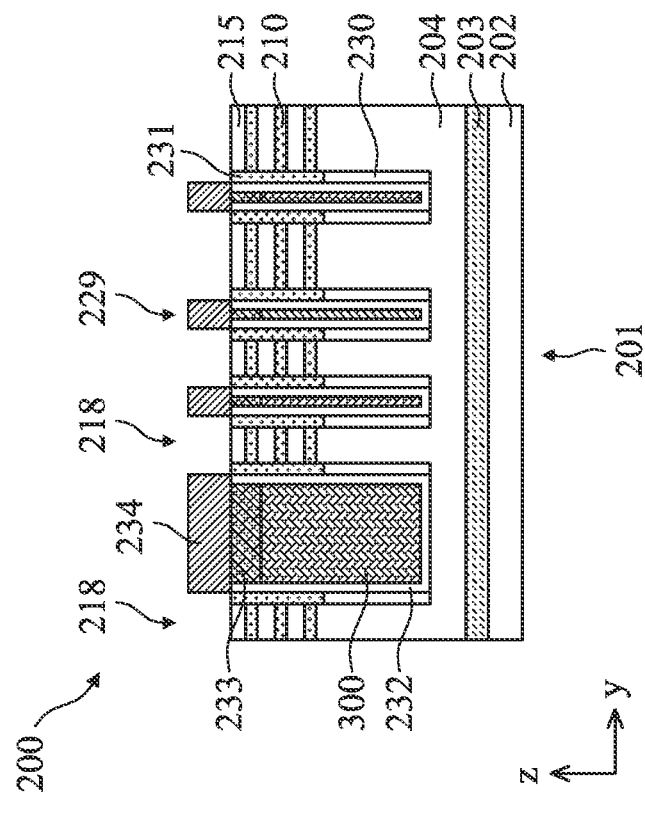
Figure 12:
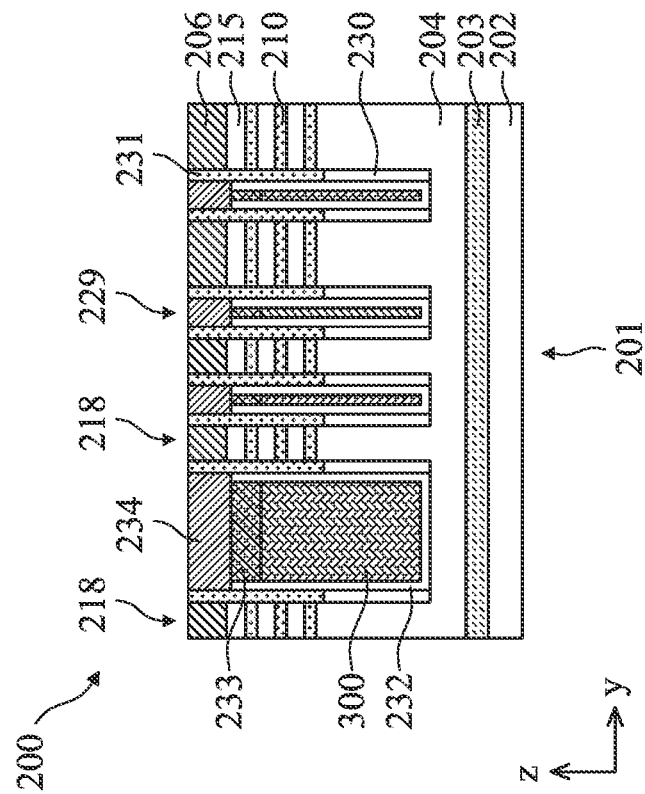

At operation 118, the method 100 (FIG. 1B) forms dielectric helmets 234 over the dielectric layers 232 and 233 and between the cladding layer 231 on opposing sidewalls of the fins 218, such as shown in FIG. 11. In an embodiment, the dielectric helmets 234 include a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than 7.0. The dielectric helmet 234 is formed by any of the processes described herein, such as ALD, CVD, PVD, oxidation-based deposition process, other suitable process, or combinations thereof. In an embodiment, the operation 118 includes recessing the dielectric layers 232 and 233 using a selective etching process that etches the dielectric layers 232 and 233 with no (or minimal) etching to the hard mask 206 and the cladding layer 231. Then, the operation 118 deposits one or more dielectric materials into the recesses and performs a CMP process to the one or more dielectric materials to form the dielectric helmets 234. The seal layer 232, the sacrificial dielectric plugs 300, the dielectric top cover 233, and the dielectric helmet 234 collectively form dielectric fins 229. The dielectric fins 229 are oriented lengthwise parallel to the fins 218 (see FIG. 13A). The dielectric fins 229 and the cladding layer 231 collectively fill the space between the adjacent fins 218.

At operation 120, the method 100 (FIG. 1B) recesses the fins 218 (particularly removing the hard mask layers 206) and the cladding layer 231 that are disposed between the dielectric helmet 234. The operation 120 may apply one or more etching processes that are selective to the hard mask layers 206 and the cladding layer 231 and with no (or minimal) etching to the dielectric helmet 234 and the semiconductor layer 215. The selective etching processes can be dry etching, wet etching, reactive ion etching, or other suitable etching methods.

Figure 13C:
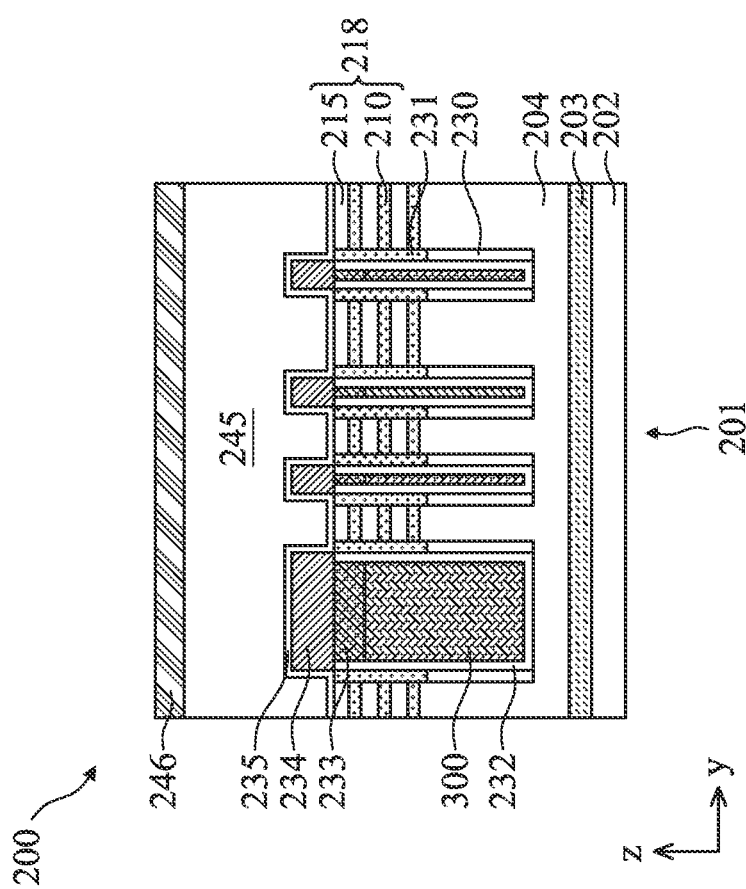

At operation 122, the method 100 (FIG. 1B) forms dummy gate stacks 240 and gate spacers 247. The resultant structure is shown in FIGS. 13A-13C according to an embodiment. FIG. 13A illustrates a top view of the device 200, and FIGS. 13B and 13C illustrate cross-sectional views of the device 200, in portion, along the B-B line and the C-C line in FIG. 13A, respectively. From a top view, the gate stacks 240 are oriented lengthwise generally along the "y" direction perpendicular to the "x" direction, while the fins 218 and the dielectric fins 229 are oriented lengthwise along the "x" direction. Referring to FIGS. 13B and 13C, each dummy gate stack 240 includes a dummy gate dielectric layer 235 over the surfaces of the fins 218 and the dielectric fins 229, a dummy gate electrode layer 245 over the dummy gate dielectric layer 235, and one or more hard mask layers 246 over the dummy gate electrode layer 245. In an embodiment, the dummy gate dielectric layer 235 includes a dielectric material, such as silicon oxide, a high-k dielectric material, other suitable dielectric material, or combinations thereof. In some embodiments, the dummy gate electrode layer 245 includes polysilicon or other suitable material and the one or more hard mask layers 246 include silicon oxide, silicon nitride, or other suitable materials. The dummy gate dielectric layer 235, the dummy gate electrode layer 245, and the hard mask layers 246 may be deposited using CVD, PVD, ALD, PECVD, LPCVD, ALCVD, APCVD, other suitable methods, or combinations thereof. A lithography patterning and etching process is then performed to pattern the one or more hard mask layers 246, the dummy gate electrode layer 245, and the dummy gate dielectric layer 235 to form dummy gate stacks 240, as depicted in FIGS. 13A-C. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

The operation 122 may further form gate spacers 247 on sidewalls of the dummy gate stacks 240, as shown in FIG. 13B. Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 240 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 240.

At operation 124, the method 100 (FIG. 1B) forms source/drain (S/D) trenches 250 by etching the fins 218 adjacent the gate spacers 247. The resultant structure is shown in FIGS. 14A-14E according to an embodiment. FIG. 14A illustrates a top view of the device 200, and FIGS. 14B, 14C, 14D, and 14E illustrate cross-sectional views of the device 200, in portion, along the B-B line, the C-C line, the D-D line, and the E-E line in FIG. 14A, respectively. Particularly, the B-B line cuts along the lengthwise direction of the fin 218, the C-C line cuts along the lengthwise direction of the gate stack 240, the D-D line cuts into one of the source/drain regions of the transistors and is parallel to the gate stacks 240, and the E-E line cuts into another source/drain regions of the transistors and is parallel to the gate stacks 240. The B-B, C-C, D-D, and E-E lines in FIGS. 15A-18A and 22A-30A are similarly configured.

In the embodiment depicted in FIGS. 14A-14E, an etching process completely removes semiconductor layer stack 205 in source/drain regions of fins 218 thereby exposing the substrate portion 204 of fins 218 in the source/drain regions. Source/drain trenches 250 thus have sidewalls defined by remaining portions of semiconductor layer stack 205, which are disposed in channel regions under the gate stacks 240, and bottoms defined by substrate 201. In some embodiments, the etching process removes some, but not all, of semiconductor layer stack 205, such that source/drain trenches 250 have bottoms defined by semiconductor layer 210 or semiconductor layer 215 in source/drain regions. In some embodiments, the etching process further removes some, but not all, of the substrate portion of fins 218, such that source/drain trenches 250 extend below a topmost surface of the semiconductor layer 204. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of gate stacks 240 and/or isolation features 230. In some embodiments, a lithography process, such as those described herein, is performed to form a patterned mask layer that covers gate stacks 240 and/or isolation features 230, and the etching process uses the patterned mask layer as an etch mask.

The operation 124 further forms inner spacers 255 (see FIG. 14B) along sidewalls of semiconductor layers 210 inside the S/D trenches 250. For example, a first etching process is performed that selectively etches semiconductor layers 210 exposed by source/drain trenches 250 with minimal (to no) etching of semiconductor layers 215, such that gaps are formed between semiconductor layers 215 and between semiconductor layers 215 and semiconductor layer 204 under gate spacers 247. Portions (edges) of semiconductor layers 215 are thus suspended in the channel regions under gate spacers 247. In some embodiments, the gaps extend partially under dummy gate stacks 240. The first etching process is configured to laterally etch (e.g., along the "x" direction) semiconductor layers 210, thereby reducing a length of semiconductor layers 210 along the "x" direction. The first etching process is a dry etching process, a wet etching process, other suitable etching process, or combinations thereof. A deposition process then forms a spacer layer over gate structures 240 and over features defining source/drain trenches 250 (e.g., semiconductor layers 215, semiconductor layers 210, and semiconductor layer 204), such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 250. The deposition process is configured to ensure that the spacer layer fills the gaps between semiconductor layers 215 and between semiconductor layers 215 and substrate 201 under gate spacers 247. A second etching process is then performed that selectively etches the spacer layer to form inner spacers 255 as depicted in FIG. 14B with minimal (to no) etching of semiconductor layers 215, dummy gate stacks 240, and gate spacers 247. In some embodiments, the spacer layer is removed from sidewalls of gate spacers 247, sidewalls of semiconductor layers 215, dummy gate stacks 240, and semiconductor layer 204. The spacer layer (and thus inner spacers 255) includes a material that is different than a material of semiconductor layers 215 and a material of gate spacers 247 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer includes a low-k dielectric material, such as those described herein. In embodiments where the device 200 is a FinFET, the inner spacer 255 is omitted.

At operation 126, the method 100 (FIG. 1B) forms a sacrificial layer 239 (see FIG. 16B) in some of the source/drain trenches 250 where backside S/D contacts will be formed. This may involve multiple processes as described below.

In an embodiment, the operation 126 performs extra etching to some of the source/drain regions of the device 200. The resultant structure is shown in FIGS. 15A-15E according to an embodiment. FIG. 15A illustrates a top view of the device 200, and FIGS. 15B, 15C, 15D, and 15E illustrate cross-sectional views of the device 200, in portion, along the B-B line, the C-C line, the D-D line, and the E-E line in FIG. 15A, respectively. In the depicted embodiment, the operation 126 forms an etch mask 241 that includes a patterned hard mask 236 and a patterned resist 237. The etch mask 241 covers the device 200 except the selected source/drain regions, which are exposed through openings 238 in the etch mask 241. Then, the operation 126 etches the selected source/drain regions deeply in the substrate 201 until only a thin layer 204 remains in the source/drain trenches 250, thereby extending the source/drain trenches 250 into the substrate 201. The etching process may include dry etching, wet etching, reactive ion etching, or other suitable etching. The etching process is substantially anisotropic (i.e., substantially vertical) in this embodiment. Also, the etching process is tuned selective to the material of the semiconductor layer 204 and with no (or minimal) etching to the gate spacers 247 and gate hard mask layers 246. After the etching process finishes, the operation 126 removes the patterned resist 237, for example, by a stripping process.

Subsequently, the operation 126 deposits a semiconductor layer 239 into the deep source/drain trenches, for example, using an epitaxial growth process or by other suitable processes. The resultant structure is shown in FIGS. 16A-16E according to an embodiment. FIG. 16A illustrates a top view of the device 200, and FIGS. 16B, 16C, 16D, and 16E illustrate cross-sectional views of the device 200, in portion, along the B-B line, the C-C line, the D-D line, and the E-E line in FIG. 16A, respectively. In some embodiments, epitaxial growth of semiconductor layers 239 is achieved by a molecular beam epitaxy (MBE) process, a chemical vapor deposition (CVD) process, a metalorganic chemical vapor deposition (MOCVD) process, other suitable epitaxial growth process, or combinations thereof. The semiconductor layer 239 includes a semiconductor material that is different than the semiconductor material included in the semiconductor layer 204 to achieve etching selectivity during subsequent processing. For example, semiconductor layers 239 and 204 may include different materials, different constituent atomic percentages, different constituent weight percentages, and/or other characteristics to achieve desired etching selectivity during an etching process. In an embodiment, the semiconductor layer 204 includes silicon and the semiconductor layer 239 includes silicon germanium. In another embodiment, semiconductor layers 239 and 204 can both include silicon germanium, but with different silicon atomic percent. The present disclosure contemplates that semiconductor layers 239 and 204 include any combination of semiconductor materials that can provide desired etching selectivity, including any of the semiconductor materials disclosed herein. The semiconductor layer 239 is deposited to a thickness such that it is near the bottom of the stack 205 (FIG. 16B) and is about level with the top surface of the isolation features 230 (FIG. 16D). The operation 126 may include an etching process that recesses the semiconductor layer 239 to the level shown in FIGS. 16B and 16D if the semiconductor layer 239 is initially grown taller than that. After the semiconductor layer 239 is deposited, the operation 126 removes the patterned hard mask layer 236 by one or more etching processes. In various embodiments, the extra etching and the growing of the semiconductor layer 239 in the operation 126 can be performed in source regions only, drain regions only, or both source and drain regions depending on designs.

At operation 128, the method 100 (FIG. 1B) epitaxially grows semiconductor S/D features 260 in the S/D trenches 250. The resultant structure is shown in FIGS. 17A-17E according to an embodiment. FIG. 17A illustrates a top view of the device 200, and FIGS. 17B, 17C, 17D, and 17E illustrate cross-sectional views of the device 200, in portion, along the B-B line, the C-C line, the D-D line, and the E-E line in FIG. 17A, respectively. As depicted, epitaxial S/D features 260 are grown from the semiconductor layers 204 and 239 at the bottom of the S/D trenches 250 and from the semiconductor layers 215 at the sidewalls of the S/D trenches 250. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 204, 239, and 215 (in particular, semiconductor layers 215). Epitaxial S/D features 260 are doped with n-type dopants or p-type dopants for n-type transistors or p-type transistors respectively. In some embodiments, for n-type transistors, epitaxial S/D features 260 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 260 include silicon germanium or germanium and can be doped with boron, other p-type dopant, or combinations thereof (for example, forming Si:Ge:B epitaxial source/drain features). In some embodiments, epitaxial S/D features 260 include more than one epitaxial semiconductor layer, where the epitaxial semiconductor layers can include the same or different materials and/or dopant concentrations. Further, in an embodiment, the S/D feature 260 adjoining to the semiconductor layer 239 includes a different material composition than the semiconductor layer 239 to achieve etch selectivity during backside via formation process. For example, in an embodiment, the semiconductor layer 239 include SiGe and the S/D feature 260 includes Si (for n-type transistor). For example, in another embodiment, the semiconductor layer 239 include SiGe with a first Ge atomic percent and the S/D feature 260 includes SiGe (for p-type transistor) with a second Ge atomic percent and the first and the second Ge atomic percent are different. In some embodiments, epitaxial S/D features 260 include materials and/or dopants that achieve desired tensile stress and/or compressive stress in respective channel regions. In some embodiments, epitaxial source/drain features 260 are doped during deposition by adding impurities to a source material of the epitaxy process (i.e., in-situ). In some embodiments, epitaxial source/drain features 260 are doped by an ion implantation process subsequent to a deposition process. In some embodiments, annealing processes (e.g., rapid thermal annealing (RTA) and/or laser annealing) are performed to activate dopants in epitaxial source/drain features 260. In some embodiments, epitaxial source/drain features 260 are formed in separate processing sequences that include, for example, masking p-type GAA transistor regions when forming epitaxial source/drain features 260 in n-type GAA transistor regions and masking n-type GAA transistor regions when forming epitaxial source/drain features 260 in p-type GAA transistor regions. Further, as shown in FIGS. 17D and 17E, the S/D features 260 are confined by the adjacent dielectric fins 229 and are shorter than the dielectric fins 229. Thus, the dielectric fins 229 isolate the adjacent S/D features 260 from accidentally merging with each other.

At operation 130, the method 100 (FIG. 1B) forms a contact etch stop layer (CESL) 269 and an inter-layer dielectric (ILD) layer 270. The resultant structure is shown in FIGS. 18A-18E according to an embodiment. FIG. 18A illustrates a top view of the device 200, and FIGS. 18B, 18C, 18D, and 18E illustrate cross-sectional views of the device 200, in portion, along the B-B line, the C-C line, the D-D line, and the E-E line in FIG. 18A, respectively. The CESL 269 is deposited over the dielectric fins 229, the S/D features 260, and along the sidewalls of the gate spacers 247. The ILD layer 270 is deposited over the CESL 269 and fills the space between opposing gate spacers 247. The CESL 269 includes a material that is different than ILD layer 270 and different than the dielectric layer 234. The CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise TEOS formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods. Subsequent to the deposition of the CESL 269 and the ILD layer 270, a CMP process and/or other planarization process can be performed until reaching (exposing) a top portion (or top surface) of dummy gate stacks 240. In some embodiments, the planarization process removes hard mask layers 246 of dummy gate stacks 240 to expose underlying dummy gate electrodes 245, such as polysilicon gate electrode layers.

At operation 132, the method 100 (FIG. 1C) replaces the dummy gate stacks 240 with functional gate stack 240' (such as high-k metal gates). The resultant structure is shown in FIGS. 19A-19C according to an embodiment. FIG. 19A illustrates a top view of the device 200, and FIGS. 19B and 19C illustrate cross-sectional views of the device 200, in portion, along the B-B line and the C-C line in FIG. 19A, respectively. This involves a variety of processes as briefly described below in conjunction with FIGS. 19C-1, 19C-2, 19C-3, and 19C-4 which illustrate cross-sectional views of the device 200, in portion, along the C-C line in FIG. 19A at different fabrication steps.

Figures 1, 19C:
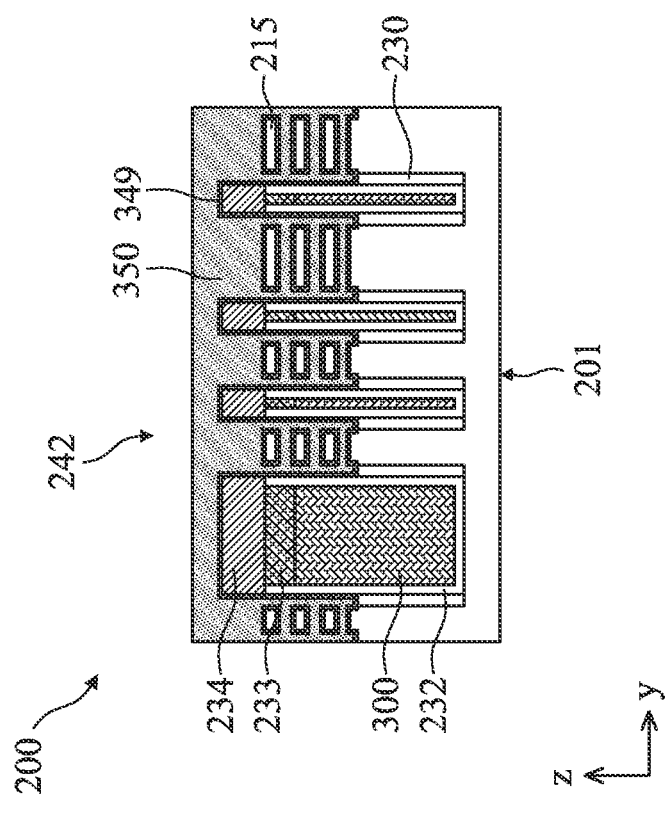
Figures 2, 19C:
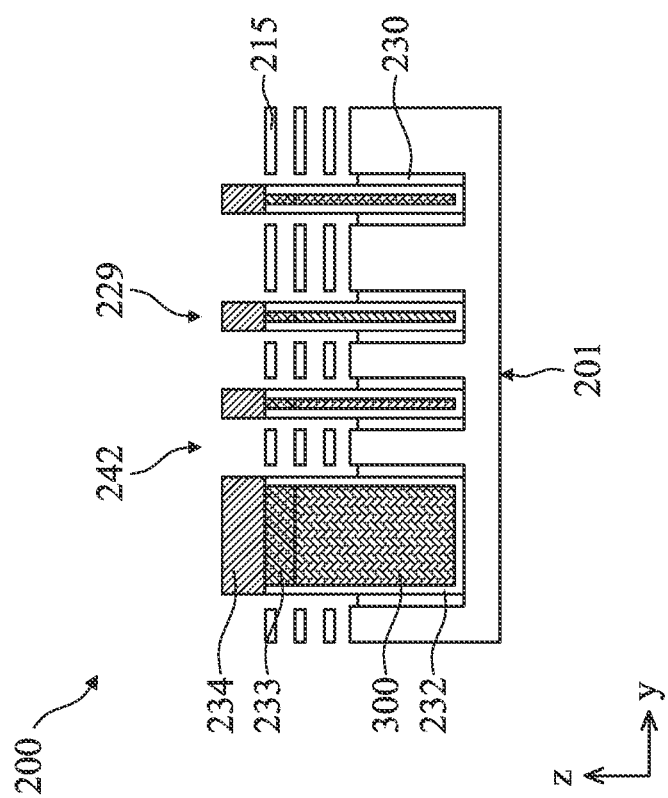
Figures 3, 4, 19C:
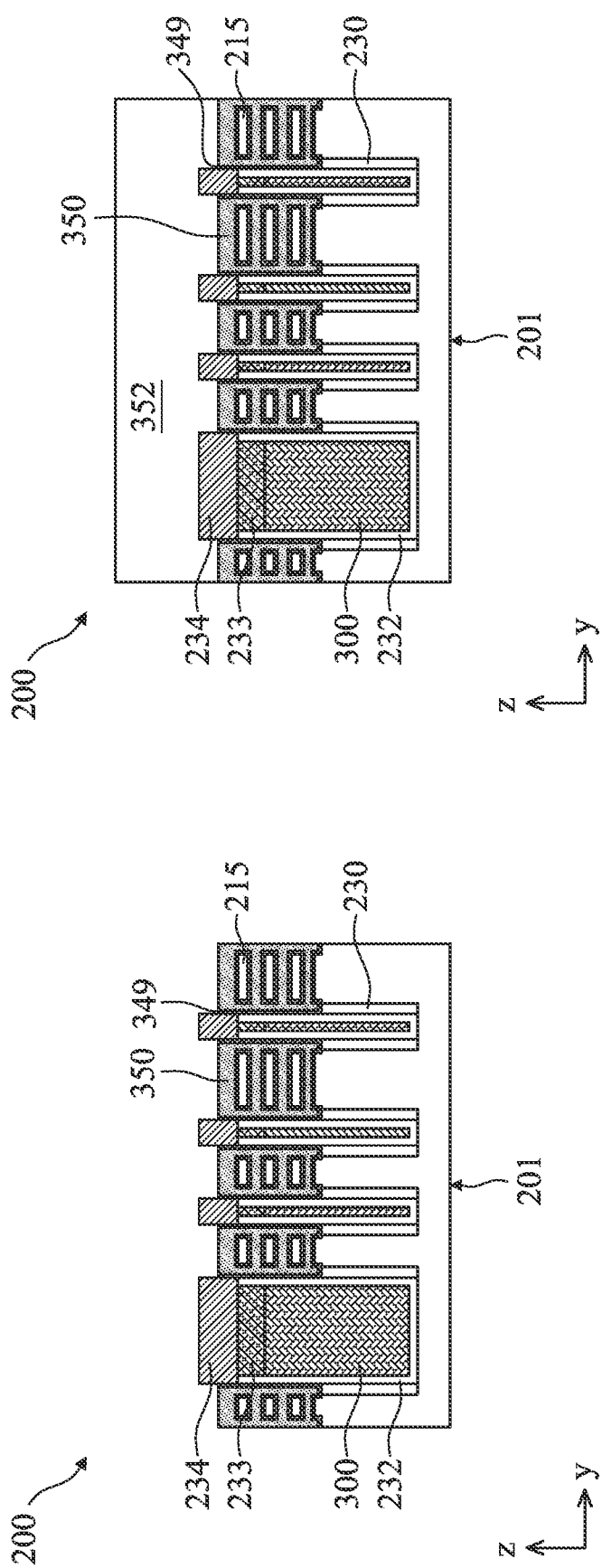

First, the operation 132 removes the dummy gate stacks 240 using one or more etching process, resulting in gate trenches 242 (comparing FIG. 13C and FIG. 19C-1). The etching process may be a dry etching process, a wet etching process, other suitable etching process, or combinations thereof. In some embodiments, the etching process is a multi-step etch process. For example, the etching process may alternate etchants to separately remove various layers of dummy gate stacks 240. In some embodiments, the etching process is configured to selectively etch dummy gate stacks 240 with minimal (to no) etching of other features of the device 200, such as ILD layer 270, gate spacers 247, isolation features 230, cladding layer 231, semiconductor layers 215, and semiconductor layers 210.

Next, the operation 132 removes the cladding layer 231 and the semiconductor layers 210 exposed in the gate trenches 242, such as shown in FIG. 19C-1. The etching process may selectively etch the cladding layer 231 with minimal (to no) etching of semiconductor layers 215, gate spacers 247, and inner spacers 255.

Next, the operation 132 removes the semiconductor layers 210 exposed in the gate trenches 242, leaving the semiconductor layers 215 suspended over the semiconductor layer 204, such as shown in FIG. 19C-1. Although not shown, the semiconductor layers 215 are still connected with the S/D features 260 along the "x" direction. This process is also referred to as a channel release process and the semiconductor layers 215 are also referred to as channel layers. The etching process selectively etches the semiconductor layers 210 with minimal (to no) etching of semiconductor layers 215 and, in some embodiments, minimal (to no) etching of gate spacers 247 and/or inner spacers 255. In embodiments where the device 200 is a FinFET, the channel release process is omitted because there is only a channel layer 215 and there are no semiconductor layers 210 in the channel region.

Next, the operation 132 forms a gate dielectric layer 349 that wraps around each of the semiconductor layers 215 and forms a gate electrode 350 over the gate dielectric layer 349, such as shown in FIG. 19C-2. The functional gate stack 240' comprises the gate dielectric layer 349 and the gate electrode 350. The gate dielectric layer 349 is also deposited over the surfaces of the dielectric fins 229 and at the bottom of the gate trenches 242. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material, or combinations thereof. The gate dielectric layer 349 may be formed by chemical oxidation, thermal oxidation, atomic layer deposition (ALD), chemical vapor deposition (CVD), and/or other suitable methods. In some embodiments, the gate stack 240' further includes an interfacial layer between the gate dielectric layer 349 and the channel layers 215. The interfacial layer may include silicon dioxide, silicon oxynitride, or other suitable materials. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. The gate electrode layer 350 is deposited to a level that is higher than the top surface of the dielectric fins 229. Since the gate stack 240' includes a high-k dielectric layer and metal layer(s), it is also referred to as a high-k metal gate.

Then, the operation 132 recesses the gate electrode layer 350 such that its top surface is below the top surface of the dielectric fins 229 (or some of the dielectric fins 229). The resultant structure is shown in FIG. 19C-3 according to an embodiment. This effectively cuts or separates the gate electrode layer 350 into multiple segments, resulting in multiple separate high-k metal gates (or high-k metal gate segments). This process is sometimes referred to as self-aligned cut metal gate process (or self-aligned metal gate cut process) because it cuts metal gates without using a photolithography process in this step and the location of the cuts is predetermined by the location of the dielectric fins 229. Self-aligned cut metal gate process is more advantageous than photolithographic cut metal gate process in that the former is less impacted by photolithography overlay window or shift. This further enhances device down-scaling. The operation 132 may implement a wet etching or a dry etching process that selectively etches the gate electrode layer 350 with minimal (to no) etching of the high-k dielectric helmet 234. In some embodiments, the etching process also has minimal (to no) etching of the high-k gate dielectric layer 349 such that the high-k gate dielectric layer 349 substantially remains over the top surface and the sidewalls of the high-k dielectric helmet 234. In some embodiments, the high-k gate dielectric layer 349 may also be etched by the operation 132. In some embodiments, the gate spacers 247 may also be partially recessed by the operation 132.

Subsequently, the operation 132 forms a dielectric capping layer 352 over the gate electrode layer 350 and over the dielectric fins 229. The resultant structure is shown in FIG. 19C-4 according to an embodiment. In some embodiments, the dielectric capping layer 352 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The dielectric capping layer 352 protects the metal gates 240' from etching and CMP processes that are used for etching S/D contact holes. The dielectric capping layer 352 may be formed by depositing one or more dielectric materials over the recessed metal gates 240' and optionally over recessed gate spacers 247 and performing a CMP process to the one or more dielectric materials.

Figure 20B:
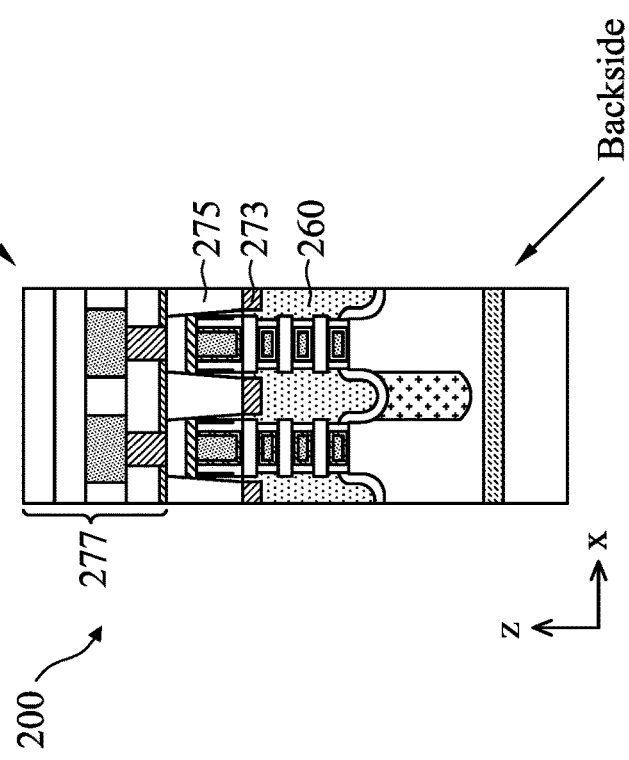
Figure 20A:
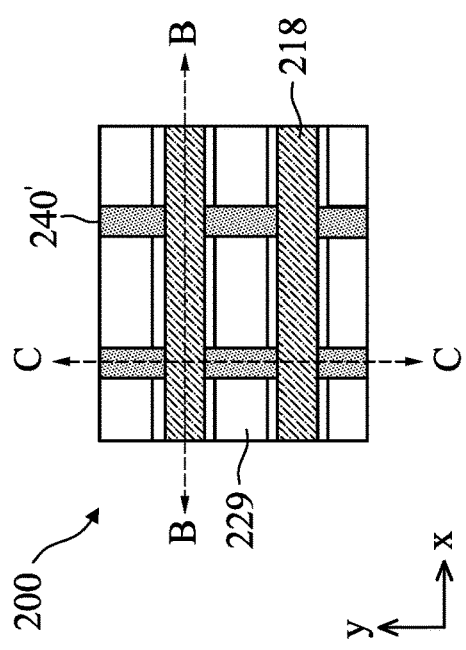
Figure 20C:
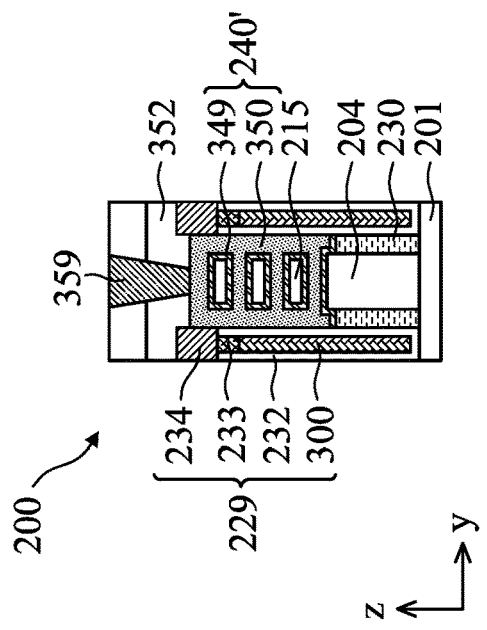

At operation 134, the method 100 (FIG. 1C) performs mid-end-of-line (MEOL) processes and back-end-of-line (BEOL) processes at the frontside of the device 200. The resultant structure is shown in FIGS. 20A, 20B, and 20C according to an embodiment. FIG. 20A illustrates a top view of the device 200, and FIGS. 20B and 20C illustrate cross-sectional views of the device 200, in portion, along the B-B line and the C-C line in FIG. 20A, respectively. For example, the operation 134 may etch S/D contact holes to expose some of the S/D features 260 and form silicide features 273 and S/D contacts 275 in the S/D contact holes. The silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 275.

The operation 134 may form gate vias 359 connecting to the gate stacks 240', form S/D contact vias connecting to the S/D contacts 275, and form one or more interconnect layers with wires and vias embedded in dielectric layers. The gate vias 359 and the S/D contact vias (not shown) may include tungsten (W), cobalt (Co), molybdenum (Mo), ruthenium (Ru), or other metals, and may be formed by CVD, PVD, ALD, plating, or other suitable processes. The one or more interconnect layers connect gate, source, and drain electrodes of various transistors, as well as other circuits in the device 200, to form an integrated circuit in part or in whole. The operation 134 may also form passivation layer(s) over the interconnect layers. In the example shown in FIG. 20B, a layer 277 is used to denote various dielectric and metal layers including interconnect layers and passivation layers formed at the frontside of the device 200 over the S/D contacts 275.

Figure 21:
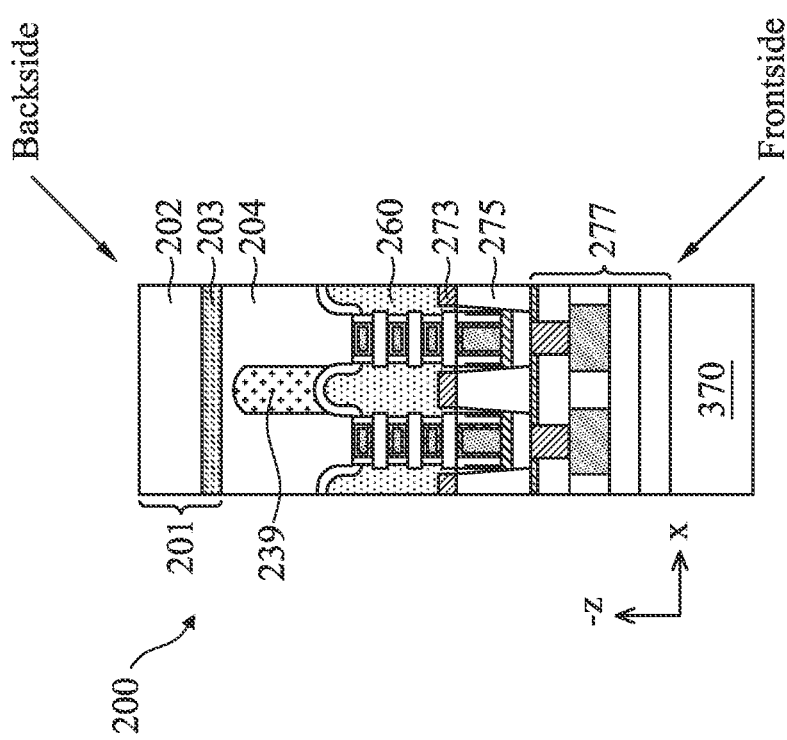

At operation 136, the method 100 (FIG. 1C) flips the device 200 upside down and attaches the frontside of the device 200 to a carrier 370, such as shown in FIG. 21. This makes the device 200 accessible from the backside of the device 200 for further processing. The operation 136 may use any suitable attaching processes, such as direct bonding, hybrid bonding, using adhesive, or other bonding methods. The operation 136 may further include alignment, annealing, and/or other processes. The carrier 370 may be a silicon wafer in some embodiment. In figures of the present disclosure, including FIG. 21 and other figures to be described below, the "z" direction points from the backside of the device 200 to the frontside of the device 200, while the "−z" direction points from the frontside of the device 200 to the backside of the device 200.

At operation 138, the method 100 (FIG. 1C) thins down the device 200 from the backside of the device 200 until the semiconductor layer 204 is exposed from the backside of the device 200. The resultant structure is shown in FIGS. 22A-22E according to an embodiment. FIG. 22A illustrates a top view of the device 200, and FIGS. 22B, 22C, 22D, and 22E illustrate cross-sectional views of the device 200, in portion, along the B-B line, the C-C line, the D-D line, and the E-E line in FIG. 22A, respectively. The semiconductor layer 239, the isolation features 230, and the seal layer 232 may be exposed or not exposed by the operation 138 in various embodiments. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

At operation 140, the method 100 (FIG. 1C) selectively etches the semiconductor layer 204 to form trenches 272 over the backside of the gate stacks 240' and the drain features 260. The resultant structure is shown in FIGS. 23A-23E according to an embodiment. FIG. 23A illustrates a top view of the device 200, and FIGS. 23B, 23C, 23D, and 23E illustrate cross-sectional views of the device 200, in portion, along the B-B line, the C-C line, the D-D line, and the E-E line in FIG. 23A, respectively. In the present embodiment, the operation 140 applies an etching process that is tuned to be selective to the materials of the semiconductor layer 204 (such as Si in an embodiment) and with no (or minimal) etching to the drain features 260, the gate stacks 240' (particularly the gate dielectric layer 349 and the gate interfacial layer if present), the isolation features 230, the semiconductor layer 239 (such as SiGe in an embodiment), and the seal layer 232. The etching process can be dry etching, wet etching, reactive ion etching, or other etching methods. Particularly, in the present embodiment, the etching of the semiconductor layer 204 is self-aligned. In other words, the operation 140 does not need to make an etch mask (e.g., an etch mask formed by photolithography processes) in order to etch the semiconductor layer 204. Rather, it relies on the etch selectivity of the materials in the semiconductor layer 204 and its surrounding layers.

Figure 24A:
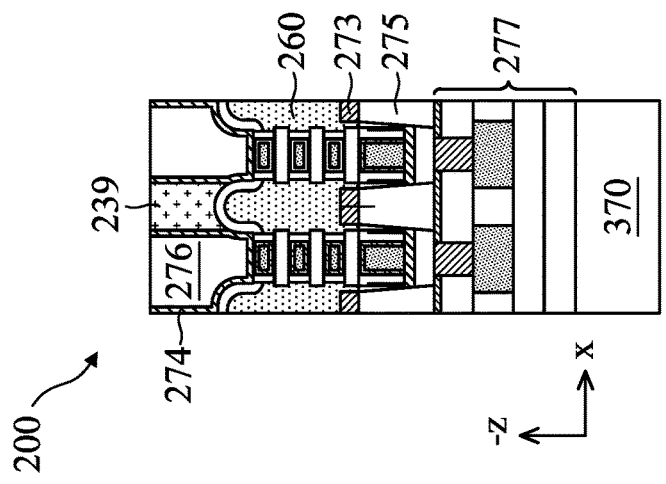
Figure 24B:
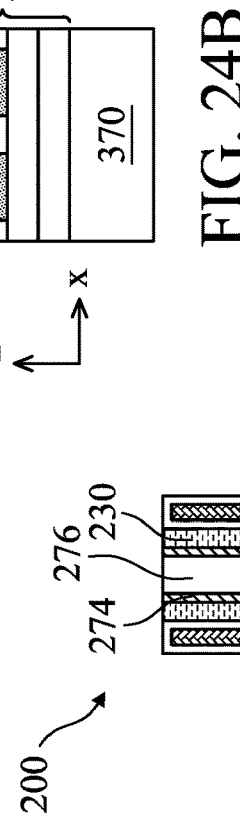
Figure 24C:
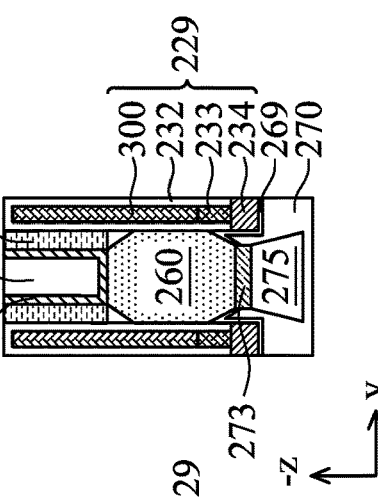
Figure 24D:
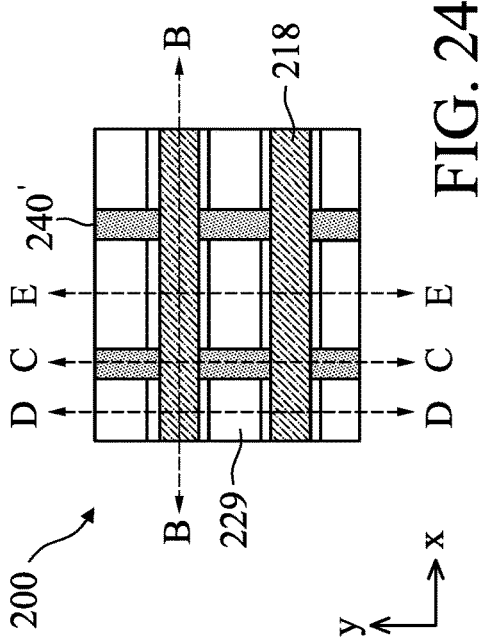
Figure 24E:
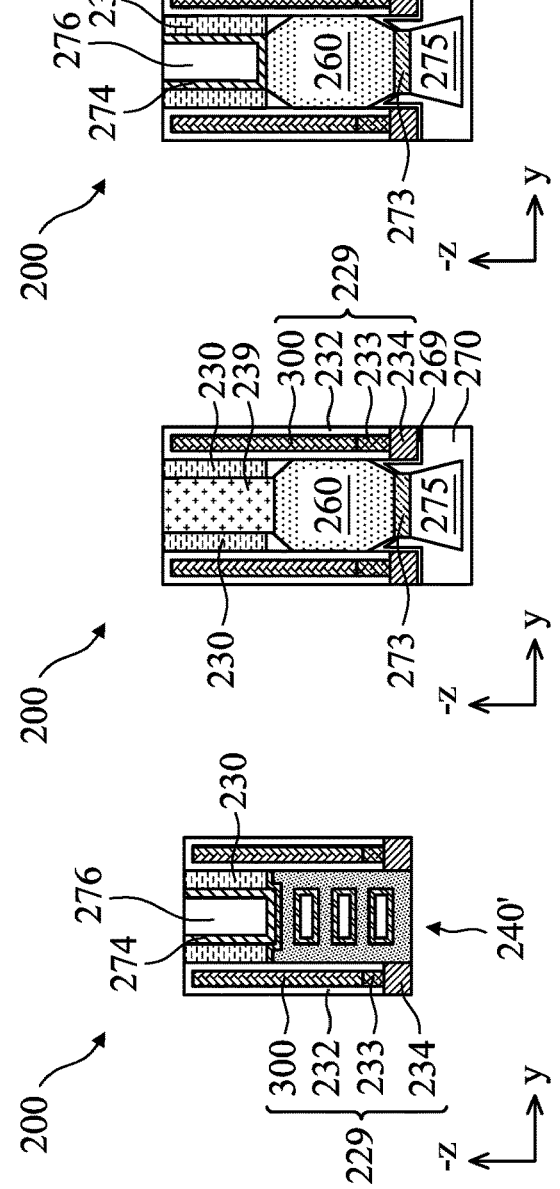

At operation 142, the method 100 (FIG. 1C) forms a dielectric liner 274 and one or more dielectric layers 276 to fill the trenches 272. The resultant structure is shown in FIGS. 24A-24E according to an embodiment. FIG. 24A illustrates a top view of the device 200, and FIGS. 24B, 24C, 24D, and 24E illustrate cross-sectional views of the device 200, in portion, along the B-B line, the C-C line, the D-D line, and the E-E line in FIG. 24A, respectively. In an embodiment, the dielectric liner 274 includes silicon nitride and the dielectric layer(s) 276 includes silicon oxide. In some embodiments, the dielectric liner 274 includes other dielectric materials such as $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). The dielectric liner 274 may have a substantially uniform thickness along the various surfaces of the trenches 272, and may be formed by CVD, PVD, ALD, or other suitable methods. In some embodiments, the dielectric layer(s) 276 may comprise TEOS formed oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer(s) 276 may be formed by PECVD (plasma enhanced CVD), FCVD (flowable CVD), or other suitable methods. The operation 142 may further perform a CMP process to planarize the backside of the device 200 and to expose the semiconductor layer 239 for further processing.

At operation 144, the method 100 (FIG. 1C) removes the semiconductor layer 239 from the backside of the device 200. The resultant structure is shown in FIGS. 25A-25E according to an embodiment. FIG. 25A illustrates a top view of the device 200, and FIGS. 25B, 25C, 25D, and 25E illustrate cross-sectional views of the device 200, in portion, along the B-B line, the C-C line, the D-D line, and the E-E line in FIG. 25A, respectively. In the present embodiment, the operation 144 applies an etching process that is tuned to be selective to the materials of the semiconductor layer 239 (such as SiGe in an embodiment) and with no (or minimal) etching to the dielectric liner 274, the dielectric layer(s) 276, the isolation features 230, and the seal layer 232. The etching process results in trenches (or contact holes) 278 that expose the source/drain features 260 from the backside of the device 200 and may partially etch the source/drain features 260 as well. The etching process can be dry etching, wet etching, reactive ion etching, or other etching methods. Particularly, in the present embodiment, the etching of the semiconductor layer 239 is self-aligned. In other words, the operation 144 does not need to make an etch mask (e.g., an etch mask formed by photolithography processes) in order to etch the semiconductor layer 239. Rather, it relies on the etch selectivity of the materials in the semiconductor layer 239 and its surrounding layers. This beneficially forms the trenches 278 to be aligned with the underlying source/drain features 260 without misalignments such as those introduced by photolithography overlay shift. Using this process will result in a backside source contact (or source via) that is ideally aligned with the source/drain features 260, as will be discussed below.

Figure 26B:
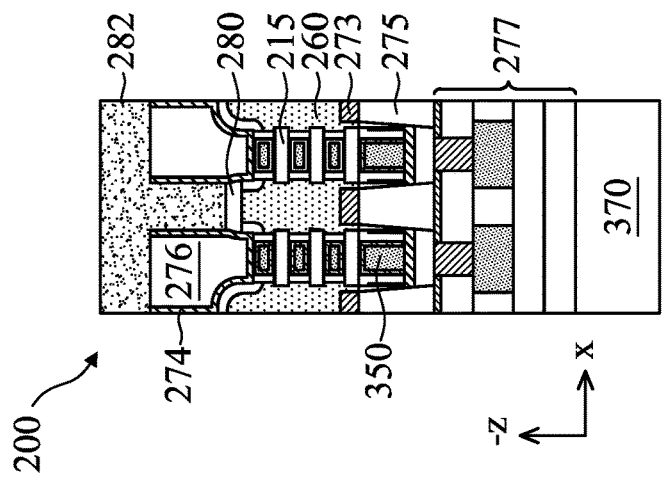
Figure 26A:
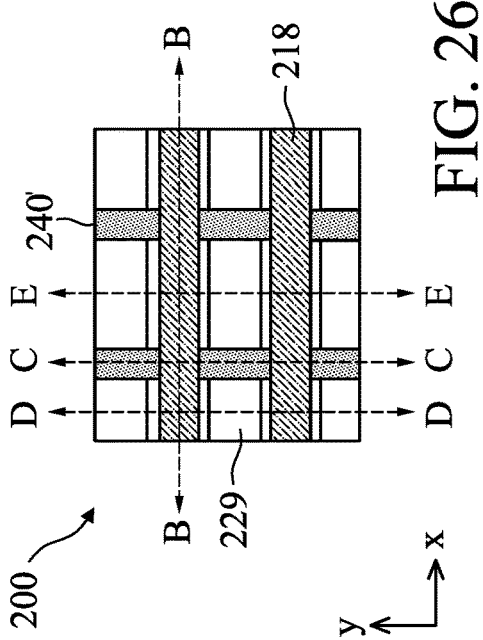
Figure 26D:
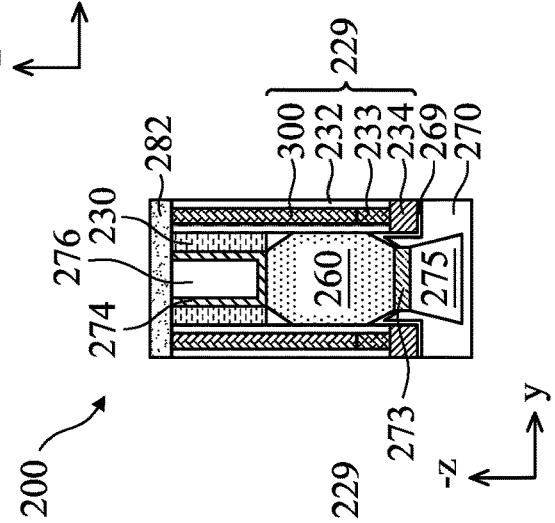
Figure 26E:
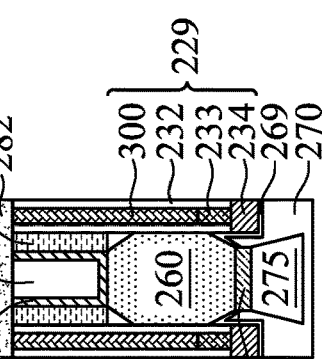
Figure 26C:
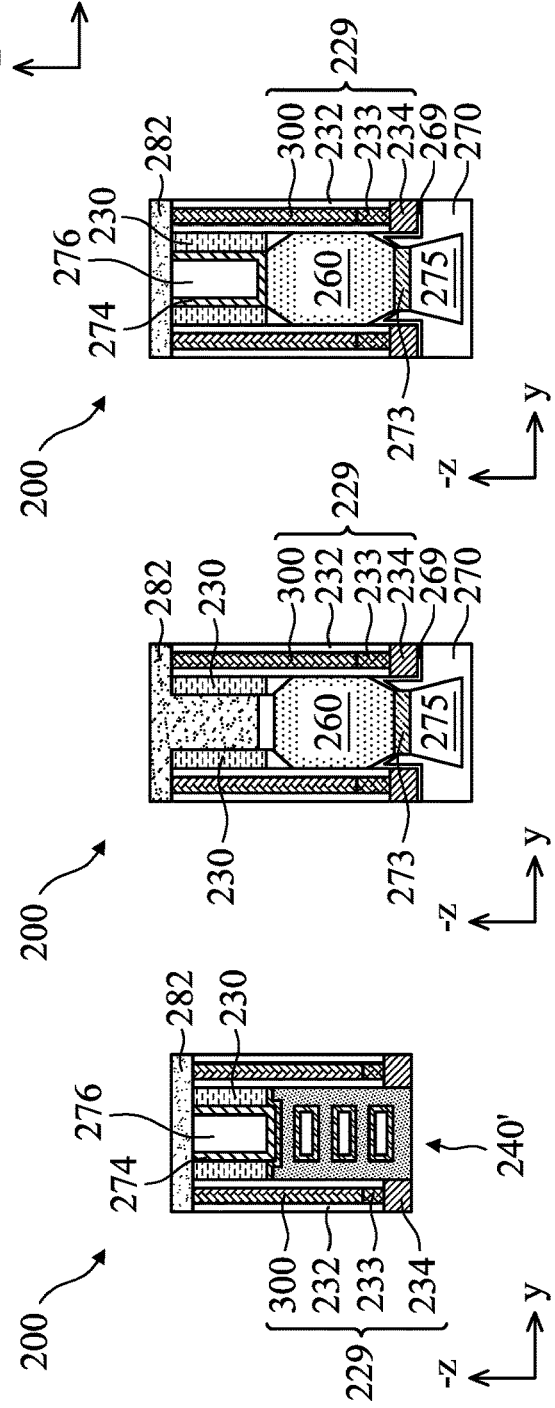

At operation 146, the method 100 (FIG. 1D) forms a backside source silicide feature 280 and deposits one or more metal layers 282 in the holes 278 and over the backside of the device 200. The resultant structure is shown in FIGS. 26A-26E according to an embodiment. FIG. 26A illustrates a top view of the device 200, and FIGS. 26B, 26C, 26D, and 26E illustrate cross-sectional views of the device 200, in portion, along the B-B line, the C-C line, the D-D line, and the E-E line in FIG. 26A, respectively. In an embodiment, the operation 146 includes depositing one or more metals into the holes 278, performing an annealing process to the device 200 to cause reaction between the one or more metals and the source/drain features 260 to produce the silicide feature 280, and removing un-reacted portions of the one or more metals, leaving the silicide features 280 in the holes 278. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the one or more metal layers 282 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), copper (Cu), aluminum (Al), titanium (Ti), tantalum (Ta), or other metals, and may be formed by CVD, PVD, ALD, plating, or other suitable processes.

At operation 148, the method 100 (FIG. 1D) performs a CMP process to the backside of the device 200 until the sacrificial dielectric plugs 300 are exposed. The resultant structure is shown in FIGS. 27A-27E according to an embodiment. FIG. 27A illustrates a top view of the device 200, and FIGS. 27B, 27C, 27D, and 27E illustrate cross-sectional views of the device 200, in portion, along the B-B line, the C-C line, the D-D line, and the E-E line in FIG. 27A, respectively. The CMP process removes bottom portions of the seal layers 232, thereby exposing the sacrificial dielectric plugs 300 from the backside of the device 200. The CMP process may also remove some of the sacrificial dielectric plugs 300 in an embodiment. The CMP process also removes excessive materials of the one or more metal layers 282. The remaining portions of the one or more metal layers 282 become the backside contacts 282.

At operation 150, the method 100 (FIG. 1D) removes the sacrificial dielectric plugs 300 from the backside of the device 200. The resultant structure is shown in FIGS. 28A-28E according to an embodiment. FIG. 28A illustrates a top view of the device 200, and FIGS. 28B, 28C, 28D, and 28E illustrate cross-sectional views of the device 200, in portion, along the B-B line, the C-C line, the D-D line, and the E-E line in FIG. 28A, respectively. In the present embodiment, the operation 150 applies an etching process that is tuned to be selective to the materials of the sacrificial dielectric plugs 300 (such as SiGe in an embodiment) and with no (or minimal) etching to the dielectric liner 274, the dielectric layer(s) 276, the isolation features 230, the seal layer 232, and the dielectric top cover 233. The etching process results in gaps 302 within the dielectric fins 229 and partially surrounded by the seal layer 232 and the dielectric top cover 233. The etching process can be dry etching, wet etching, reactive ion etching, or other etching methods. Particularly, in the present embodiment, the etching of the sacrificial dielectric plugs 300 is self-aligned. In other words, the operation 150 does not need to make an etch mask (e.g., an etch mask formed by photolithography processes) in order to etch the sacrificial dielectric plugs 300. Rather, it relies on the etch selectivity of the materials in the sacrificial dielectric plugs 300 and its surrounding layers.

At operation 152, the method 100 (FIG. 1D) forms a dielectric bottom cover 304 that seals the gaps 302 from the backside of the device 200. The resultant structure is shown in FIGS. 29A-29E according to an embodiment. FIG. 29A illustrates a top view of the device 200, and FIGS. 29B, 29C, 29D, and 29E illustrate cross-sectional views of the device 200, in portion, along the B-B line, the C-C line, the D-D line, and the E-E line in FIG. 29A, respectively. The dielectric bottom cover 304 uses a material that has a high deposition rate or a high growth rate such that it can quickly seal off the opening of the gaps 302 without depositing much into the gaps 302. In an embodiment, the dielectric bottom cover 304 include silicon dioxide. In some embodiments, the dielectric bottom cover 304 may comprise TEOS formed oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric bottom cover 304 may be formed by PECVD, or other suitable methods. In an embodiment, the operation 152 deposits one or more dielectric materials over the backside of the device 200 and sealing the gaps 302, and then performs a CMP process to the one or more dielectric materials. The portions of the one or more dielectric materials remaining inside the gaps 302 become the dielectric bottom cover 304. The backside of the device 200 is also planarized.

As depicted in FIGS. 29A-29E, the dielectric fins 229 now include the seal layer 232, the dielectric bottom cover 304, the dielectric top cover 233, the dielectric helmet 234, and the air gap 302. The seal layer 232 is now separated into multiple seal features 232 with their top portions separated by the dielectric top cover 233 and their bottom portions separated by the dielectric bottom cover 304. The air gaps 302 are surrounded by the seal features 232, the dielectric bottom cover 304, and the dielectric top cover 233. As shown in FIG. 29A, the dielectric fins 229 are disposed laterally (along the "y" direction) between adjacent S/D features 260 and disposed laterally (along the "x" direction) between adjacent metal gates 240'. In the present embodiment, the air gaps 302 extend vertically (along the "z" direction) parallel to a majority (i.e., more than 50%) of the height of the metal gates 240' and a majority (i.e., more than 50%) of the height of the S/D features 260. Because air has the lowest dielectric constant (its k value is about 1.0), the dielectric fins 229 advantageously reduce the coupling capacitance between adjacent S/D features 260 and between adjacent metal gates 240' and improves the device 200's performance. Viewed along the "z" direction, a top surface of the backside source/drain contacts 282 is above a top surface of the dielectric bottom cover 304. A portion of the isolation feature 230 is disposed between the backside source/drain contacts 282 and the seal layer 232. In some embodiments as depicted in FIGS. 29D and 29E, some air voids (or air gaps) 302 are surrounded by the seal layer 232, the isolation features 230, and the S/D features 260. In the present embodiment, the seal layer 232 (or seal features 232) is in direct contact with the metal gates 240' and the S/D features 260. Viewed along the "z" direction in FIGS. 29D and 29E, the dielectric fins 229 (particularly the dielectric helmet 234) extend above the S/D features 260. Viewed along the "z" direction, the dielectric fins 229 (particularly the dielectric helmet 234) also extend above the metal gates 240' (see FIG. 19C-4), which is not illustrated in the partial view of FIG. 29C.

At operation 154, the method 100 (FIG. 1D) forms backside power rails 284. The resultant structure is shown in FIGS. 30A-30E according to an embodiment. FIG. 30A illustrates a top view of the device 200, and FIGS. 30B, 30C, 30D, and 30E illustrate cross-sectional views of the device 200, in portion, along the B-B line, the C-C line, the D-D line, and the E-E line in FIG. 30A, respectively. As illustrated in FIGS. 30B and 30D, the backside source/drain contacts 282 are electrically connected to the backside power rails 284. As illustrated in FIGS. 30C and 30E, the metal gates 240' and some of the S/D features 260 are isolated from the backside power rails 284. The dielectric fins 229 may be in direct contact with the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), aluminum (Al), titanium (Ti), tantalum (Ta), or other metals, and may be deposited by CVD, PVD, ALD, plating, or other suitable processes. Although not shown in FIG. 30A-30E, the backside power rails 284 are embedded in one or more dielectric layers. Having backside power rails 284 beneficially increases the number of metal tracks available in the device 200 for directly connecting to source/drain contacts and vias. It also increases the gate density for greater device integration than other structures without the backside power rails 284. The backside power rails 284 may have wider dimension than the first level metal (M0) tracks on the frontside of the device 200, which beneficially reduces the backside power rail resistance.

Figure 31:
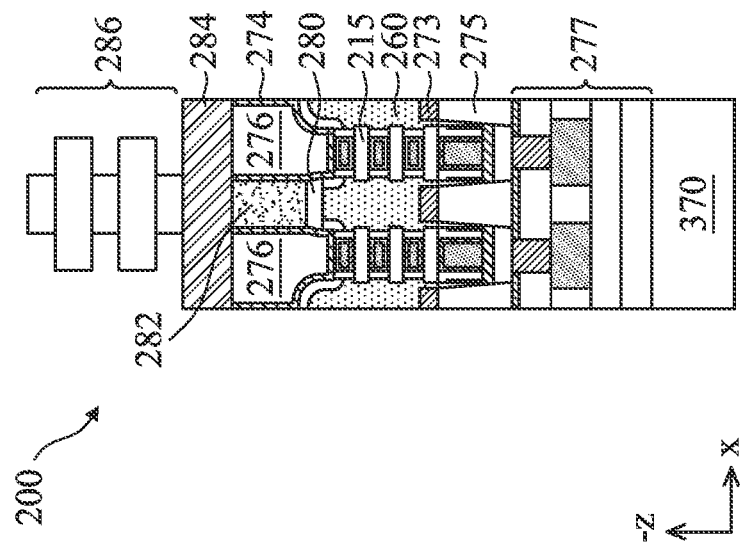

At operation 156, the method 100 (FIG. 1D) performs further fabrication processes to the device 200. For example, it may form a backside interconnect 286 (FIG. 31). The backside interconnect 286 includes wires and vias embedded in one or more dielectric layers. In some embodiment, the backside power rails 284 are considered part of the backside interconnect 286. The operation 156 may also form passivation layers on the backside of the device 200, remove the carrier 370, and perform other BEOL processes.

Although not intended to be limiting, embodiments of the present disclosure provide one or more of the following advantages. For example, embodiments of the present disclosure form dielectric fins with air gaps for isolating metal gates and isolating S/D features. The dielectric fins are formed by a combination of wafer frontside processes and wafer backside processes. The air gaps in the dielectric fins further reduce coupling capacitance between adjacent metal gates and between adjacent S/D features. The dielectric fins also function to cut metal gates in a self-aligned manner to further improve device integration. Embodiments of the present disclosure can be readily integrated into existing semiconductor manufacturing processes.

In one example aspect, the present disclosure is directed to a method that includes providing a structure having two fins extending from a substrate and an isolation structure adjacent to lower portions of the fins; forming a cladding layer over the isolation structure and over top and sidewalls of the fins; recessing the isolation structure using the cladding layer as an etch mask to expose the substrate; after the recessing of the isolation structure, depositing a seal layer over the substrate, the isolation structure, and the cladding layer; forming a sacrificial plug over the seal layer and between the two fins; and depositing a dielectric top cover over the sacrificial plug and laterally between the two fins.

In an embodiment, the method further includes recessing the dielectric top cover and the seal layer, thereby forming a gap between the cladding layer on the two fins; and forming a high-k dielectric helmet in the gap.

In another embodiment, the method further includes forming dummy gate stacks and gate spacers over the fins; etching source/drain trenches into the fins and adjacent the gate spacers; forming source/drain features in the source/drain trenches; and replacing the dummy gate stacks with high-k metal gates. In a further embodiment, the method further includes thinning down the substrate from a backside of the structure until the fins are exposed; forming a backside dielectric layer over the backside of the structure; forming a backside via extending through the backside dielectric layer and electrically connecting to at least one of the source/drain features; after forming the backside via, performing a chemical mechanical planarization process to the backside of the structure until the sacrificial plug is exposed; removing the sacrificial plug, resulting in a trench from the backside of the structure; and sealing the trench with a dielectric bottom cover, resulting in an air gap surrounded by the seal layer, the dielectric top cover, and the dielectric bottom cover. In some embodiments, the sacrificial plug comprises silicon germanium, the seal layer comprises silicon carbon nitride, the dielectric top cover comprises silicon dioxide, and the dielectric bottom cover comprises silicon dioxide. In some embodiments, the cladding layer comprises silicon germanium. In some embodiments, the backside via extends above the dielectric bottom cover.

In some embodiments, each of the fins includes a stack of first semiconductor layers and second semiconductor layers alternately arranged one over another.

In another example aspect, the present disclosure is directed to a method that includes providing a structure having two fins extending from a substrate and an isolation structure adjacent to lower portions of the fins, wherein each of the fins includes first semiconductor layers and second semiconductor layers alternately stacked one over another. The method further includes forming a cladding layer over the isolation structure and over top and sidewalls of the fins; recessing the isolation structure using the cladding layer as an etch mask to expose the substrate; forming a seal layer over the substrate, the isolation structure, and the cladding layer; forming a sacrificial plug filling space between the seal layer over opposing sidewalls of the two fins, wherein a top surface of the sacrificial plug is below a topmost layer of the first semiconductor layers; depositing a dielectric top cover over the sacrificial plug; and forming a high-k dielectric helmet over the dielectric top cover and the seal layer, resulting in dielectric fins comprising the seal layer, the dielectric top cover, and the high-k dielectric helmet.

In an embodiment, the forming of the high-k dielectric helmet includes recessing the dielectric top cover and the seal layer, thereby forming a gap between the cladding layer on the opposing sidewalls of the two fins; and depositing one or more high-k dielectric materials into the gap.

In an embodiment, the method further includes forming dummy gate stacks and gate spacers over the fins; etching source/drain trenches into the fins and adjacent the gate spacers; forming inner spacers in the source/drain trenches; and forming source/drain features in the source/drain trenches, wherein the source/drain features are separated by the dielectric fins. In some further embodiments, the method includes removing the dummy gate stacks, resulting in gate trenches; removing the second semiconductor layers exposed in the gate trenches; depositing a high-k metal gate in the gate trenches; and etching back the high-k metal gate until a top surface of the high-k metal gate is below a top surface of the dielectric fins. In some further embodiments, the method includes forming a backside dielectric layer over the backside of the structure; and forming a backside via extending through the backside dielectric layer and electrically connecting to at least one of the source/drain features. In some further embodiments, the method includes, after forming the backside via, performing another CMP process to the backside of the structure until the sacrificial plug is exposed; removing the sacrificial plug, resulting in a trench from the backside of the structure; and depositing a dielectric bottom cover at an opening of the trench, resulting in an air gap surrounded by the seal layer, the dielectric top cover, and the dielectric bottom cover. In an embodiment, the sacrificial plug comprises silicon germanium, the seal layer comprises silicon carbon nitride, the dielectric top cover comprises silicon dioxide, and the dielectric bottom cover comprises silicon dioxide. In some further embodiments, the method includes forming a power rail at the backside of the structure and electrically connecting to the backside via.

In yet another example aspect, the present disclosure is directed to a semiconductor structure that includes a power rail; a dielectric layer over the power rail; two source/drain features over the dielectric layer; a via structure extending through the dielectric layer and electrically connecting one of the source/drain features to the power rail; and a dielectric fin disposed laterally between the two source/drain features. The dielectric fin includes two seal dielectric features over sidewalls of the source/drain features, a dielectric bottom cover between bottom portions of the seal dielectric features, a dielectric top cover between top portions of the seal dielectric features, and an air gap surrounded by the seal dielectric features, the dielectric bottom cover, and the dielectric top cover, wherein a top surface of the via structure is above a top surface of the dielectric bottom cover.

In an embodiment, the dielectric fin further includes a high-k dielectric helmet disposed over the dielectric top cover and the top portions of the seal dielectric features. In an embodiment, the seal dielectric features comprise silicon carbon nitride, the dielectric top cover comprises silicon dioxide, and the dielectric bottom cover comprises silicon dioxide. In an embodiment, the semiconductor structure further includes an isolation feature between one of the seal dielectric features and the via structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
providing a structure having two fins extending from a substrate and an isolation structure adjacent to lower portions of the fins;

forming a cladding layer over top and sidewalls of the fins and exposing the isolation structure;
recessing the isolation structure using the cladding layer as an etch mask to expose the substrate;
after the recessing of the isolation structure, depositing a seal layer over the substrate, the isolation structure, and the cladding layer;
forming a sacrificial plug over the seal layer and between the two fins; and
depositing a dielectric top cover over the sacrificial plug and laterally between the two fins.

2. The method of claim 1, further comprising:
recessing the dielectric top cover and the seal layer, thereby forming a gap between the cladding layer on the two fins; and
forming a high-k dielectric helmet in the gap.

3. The method of claim 1, further comprising:
forming dummy gate stacks and gate spacers over the fins;
etching source/drain trenches into the fins and adjacent the gate spacers;
forming source/drain features in the source/drain trenches; and
replacing the dummy gate stacks with high-k metal gates.

4. The method of claim 3, further comprising:
thinning down the substrate from a backside of the structure until the fins are exposed;
forming a backside dielectric layer over the backside of the structure;
forming a backside via extending through the backside dielectric layer and electrically connecting to at least one of the source/drain features;
after forming the backside via, performing a chemical mechanical planarization process to the backside of the structure until the sacrificial plug is exposed;
removing the sacrificial plug, resulting in a trench from the backside of the structure; and
sealing the trench with a dielectric bottom cover, resulting in an air gap surrounded by the seal layer, the dielectric top cover, and the dielectric bottom cover.

5. The method of claim 4, wherein the sacrificial plug comprises silicon germanium, the seal layer comprises silicon carbon nitride, the dielectric top cover comprises silicon dioxide, and the dielectric bottom cover comprises silicon dioxide.

6. The method of claim 5, wherein the cladding layer comprises silicon germanium.

7. The method of claim 4, wherein the backside via extends above the dielectric bottom cover.

8. The method of claim 1, wherein each of the fins includes a stack of first semiconductor layers and second semiconductor layers alternately arranged one over another.

9. A method, comprising:
providing a structure having two fins extending from a substrate and an isolation structure adjacent to lower portions of the fins, wherein each of the fins includes first semiconductor layers and second semiconductor layers alternately stacked one over another;
forming a cladding layer over top and sidewalls of the fins and exposing the isolation structure;
recessing the isolation structure using the cladding layer as an etch mask to expose the substrate;
forming a seal layer over the substrate, the isolation structure, and the cladding layer;
forming a sacrificial plug filling space between the seal layer over opposing sidewalls of the two fins, wherein a top surface of the sacrificial plug is below a topmost layer of the first semiconductor layers;
depositing a dielectric top cover over the sacrificial plug; and
forming a high-k dielectric helmet over the dielectric top cover and the seal layer, resulting in dielectric fins comprising the seal layer, the dielectric top cover, and the high-k dielectric helmet.

10. The method of claim 9, wherein the forming of the high-k dielectric helmet includes:
recessing the dielectric top cover and the seal layer, thereby forming a gap between the cladding layer on the opposing sidewalls of the two fins; and
depositing one or more high-k dielectric materials into the gap.

11. The method of claim 9, further comprising:
forming dummy gate stacks and gate spacers over the fins;
etching source/drain trenches into the fins and adjacent the gate spacers;
forming inner spacers in the source/drain trenches; and
forming source/drain features in the source/drain trenches, wherein the source/drain features are separated by the dielectric fins.

12. The method of claim 11, further comprising:
removing the dummy gate stacks, resulting in gate trenches;
removing the second semiconductor layers exposed in the gate trenches;
depositing a high-k metal gate in the gate trenches; and
etching back the high-k metal gate until a top surface of the high-k metal gate is below a top surface of the dielectric fins.

13. The method of claim 12, further comprising:
forming a backside dielectric layer over the backside of the structure; and
forming a backside via extending through the backside dielectric layer and electrically connecting to at least one of the source/drain features.

14. The method of claim 13, further comprising:
after forming the backside via, performing another CMP process to the backside of the structure until the sacrificial plug is exposed;
removing the sacrificial plug, resulting in a trench from the backside of the structure; and
depositing a dielectric bottom cover at an opening of the trench, resulting in an air gap surrounded by the seal layer, the dielectric top cover, and the dielectric bottom cover.

15. The method of claim 14, wherein the sacrificial plug comprises silicon germanium, the seal layer comprises silicon carbon nitride, the dielectric top cover comprises silicon dioxide, and the dielectric bottom cover comprises silicon dioxide.

16. The method of claim 14, further comprising:
forming a power rail at the backside of the structure and electrically connecting to the backside via.

17. A method, comprising:
providing a structure having two fins extending from a substrate and an isolation structure adjacent to lower portions of the fins;
forming a cladding layer over top and sidewalls of the fins and exposing the isolation structure;
recessing the isolation structure using the cladding layer as an etch mask to expose the substrate;
after the recessing of the isolation structure, depositing a seal layer over the substrate, the isolation structure, and the cladding layer;
forming a sacrificial plug over the seal layer and between the two fins;

depositing a dielectric top cover over the sacrificial plug and laterally between the two fins;

thinning down the substrate from a backside of the structure until the fins are exposed;

forming a backside dielectric layer over the backside of the structure;

performing a chemical mechanical planarization process to the backside of the structure until the sacrificial plug is exposed;

removing the sacrificial plug, resulting in a trench from the backside of the structure; and sealing the trench with a dielectric bottom cover, resulting in an air gap surrounded by the seal layer, the dielectric top cover, and the dielectric bottom cover.

18. The method of claim 17, further comprising:

before performing the chemical mechanical planarization process, forming a backside via extending through the backside dielectric layer.

19. The method of claim 17, after depositing the dielectric top cover and before thinning down the substrate, further comprising:

forming dummy gate stacks and gate spacers over the fins;

etching source/drain trenches into the fins and adjacent the gate spacers;

forming source/drain features in the source/drain trenches; and replacing the dummy gate stacks with high-k metal gates.

20. The method of claim 17, wherein the sacrificial plug comprises silicon germanium, the seal layer comprises silicon carbon nitride, the dielectric top cover comprises silicon dioxide, and the dielectric bottom cover comprises silicon dioxide.

* * * * *